US010204893B2

(12) United States Patent
Uzoh et al.

(10) Patent No.: US 10,204,893 B2
(45) Date of Patent: Feb. 12, 2019

(54) STACKED DIES AND METHODS FOR FORMING BONDED STRUCTURES

(71) Applicant: INVENSAS BONDING TECHNOLOGIES, INC., San Jose, CA (US)

(72) Inventors: Cyprian Emeka Uzoh, San Jose, CA (US); Arkalgud R. Sitaram, Cupertino, CA (US); Paul Enquist, Cary, NC (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 15/159,649

(22) Filed: May 19, 2016

(65) Prior Publication Data
US 2017/0338214 A1 Nov. 23, 2017

(51) Int. Cl.
H01L 25/00 (2006.01)
H01L 21/308 (2006.01)
H01L 25/065 (2006.01)
H01L 21/304 (2006.01)
H01L 21/683 (2006.01)
(Continued)

(52) U.S. Cl.
CPC .......... *H01L 25/50* (2013.01); *H01L 21/304* (2013.01); *H01L 21/306* (2013.01); *H01L 21/3081* (2013.01); *H01L 21/561* (2013.01); *H01L 21/683* (2013.01); *H01L 23/3121* (2013.01); *H01L 23/3135* (2013.01); *H01L 25/0657* (2013.01); *H01L 2225/06513* (2013.01);
(Continued)

(58) Field of Classification Search
CPC ............. H01L 2224/03; H01L 21/304; H01L 2924/3512; H01L 2224/85205; H01L 21/561; H01L 23/562; H01L 24/03; H01L 24/05; H01L 2924/14; H01L 21/2007; H01L 21/76251; H01L 21/187; H01L 25/50; H01L 23/3121; H01L 25/0657
See application file for complete search history.

(56) References Cited

U.S. PATENT DOCUMENTS 4,998,665 A   3/1991  Hayashi
5,019,673 A * 5/1991  Juskey .................... H01L 24/10
                                                    174/527
(Continued)

FOREIGN PATENT DOCUMENTS

JP   4-337694     * 11/1992 ............. H01L 23/31
JP   2000-100679    4/2000
(Continued)

OTHER PUBLICATIONS

U.S. Appl. No. 14/835,379, filed Aug. 25, 2015, Enquist.
(Continued)

*Primary Examiner* — Jasmine Clark
(74) *Attorney, Agent, or Firm* — Knobbe, Martens, Olson & Bear, LLP

(57) ABSTRACT

In various embodiments, a method for forming a bonded structure is disclosed. The method can comprise mounting a first integrated device die to a carrier. After mounting, the first integrated device die can be thinned. The method can include providing a first layer on an exposed surface of the first integrated device die. At least a portion of the first layer can be removed. A second integrated device die can be directly bonded to the first integrated device die without an intervening adhesive.

30 Claims, 14 Drawing Sheets

(51) Int. Cl.
*H01L 21/306* (2006.01)
*H01L 23/31* (2006.01)
*H01L 21/56* (2006.01)

(52) U.S. Cl.
CPC ............... *H01L 2225/06541* (2013.01); *H01L 2924/351* (2013.01)

(56) References Cited

U.S. PATENT DOCUMENTS

| | | | |
|---|---|---|---|
| 5,087,585 | A | 2/1992 | Hayashi |
| 5,322,593 | A | 6/1994 | Hasegawa et al. |
| 5,956,605 | A * | 9/1999 | Akram ................ H01L 23/3171 228/180.22 |
| 5,985,739 | A | 11/1999 | Plettner et al. |
| 5,998,808 | A | 12/1999 | Matsushita |
| 6,008,126 | A | 12/1999 | Leedy |
| 6,080,640 | A | 6/2000 | Gardner et al. |
| 6,121,688 | A * | 9/2000 | Akagawa .......... H01L 23/49816 257/737 |
| 6,265,775 | B1 | 7/2001 | Seyyedy |
| 6,374,770 | B1 | 4/2002 | Lee |
| 6,582,991 | B1 | 6/2003 | Maeda et al. |
| 6,887,769 | B2 | 5/2005 | Kellar et al. |
| 7,078,811 | B2 | 7/2006 | Suga |
| 7,126,212 | B2 | 10/2006 | Enquist et al. |
| 7,354,798 | B2 | 4/2008 | Pogge et al. |
| 8,183,127 | B2 | 5/2012 | Patti et al. |
| 8,241,961 | B2 | 8/2012 | Kim et al. |
| 8,314,007 | B2 | 11/2012 | Vaufredaz |
| 8,461,017 | B2 * | 6/2013 | Sadaka ............... H01L 23/5384 257/E21.211 |
| 8,476,146 | B2 | 7/2013 | Chen et al. |
| 8,841,002 | B2 | 9/2014 | Tong |
| 9,171,756 | B2 | 10/2015 | Enquist et al. |
| 9,184,125 | B2 | 11/2015 | Enquist et al. |
| 9,331,149 | B2 | 5/2016 | Tong et al. |
| 9,385,024 | B2 | 7/2016 | Tong et al. |
| 9,496,239 | B1 | 11/2016 | Edelstein et al. |
| 2002/0000328 | A1 | 1/2002 | Motomura et al. |
| 2002/0003307 | A1 | 1/2002 | Suga |
| 2005/0040530 | A1 * | 2/2005 | Shi ........................ H01L 23/057 257/750 |
| 2005/0153522 | A1 | 7/2005 | Hwang et al. |
| 2007/0158024 | A1 | 7/2007 | Addison et al. |
| 2008/0265421 | A1 * | 10/2008 | Brunnbauer .......... H01L 21/561 257/758 |
| 2009/0068831 | A1 | 3/2009 | Enquist et al. |
| 2010/0123268 | A1 | 5/2010 | Menard |
| 2013/0307165 | A1 * | 11/2013 | Wang ................ H01L 21/76251 257/782 |
| 2014/0154839 | A1 | 6/2014 | Ahn et al. |
| 2014/0299981 | A1 | 10/2014 | Goh et al. |
| 2014/0370658 | A1 | 12/2014 | Tong et al. |
| 2015/0179481 | A1 * | 6/2015 | Lin ........................ H01L 21/568 257/790 |
| 2015/0340285 | A1 | 11/2015 | Enquest et al. |
| 2017/0062366 | A1 | 3/2017 | Enquist |
| 2017/0179029 | A1 | 6/2017 | Enquist et al. |
| 2017/0200711 | A1 | 7/2017 | Uzoh et al. |
| 2018/0096931 | A1 | 4/2018 | Huang et al. |

FOREIGN PATENT DOCUMENTS

| | | |
|---|---|---|
| JP | 2001-102479 | 4/2001 |
| JP | 2002-353416 | 12/2002 |
| JP | 2004-193493 | 7/2004 |
| KR | 10-2001-0104643 | 11/2001 |
| WO | WO 2010/024678 A1 | 3/2010 |

OTHER PUBLICATIONS

U.S. Appl. No. 62/269,412, filed Dec. 18, 2015, Enquist et al.
Amirfeiz et al., "Formation of silicon structures by plasma-activated wafer bonding," Journal of The Electrochemical Society, 2000, vol. 147, No. 7, pp. 2693-2698.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7—pp.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Conference, 2001, 51st Proceedings, IEEE, pp. 384-387.

(56) References Cited

OTHER PUBLICATIONS

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.

Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, Mems 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
U.S. Appl. No. 15/379,942, filed Dec. 15, 2016, Enquist et al.
U.S. Appl. No. 15/387,385, field Dec. 21, 2016, Wang et al.
U.S. Appl. No. 15/389,157, filed Dec. 22, 2016, Uzoh et al.
U.S. Appl. No. 15/395,197, filed Dec. 30, 2016, Huang et al.
U.S. Appl. No. 15/426,942, filed Feb. 7, 2017, DeLaCruz et al.
International Search Report and Written Opinion dated Apr. 17, 2017, issued in International Application No. PCT/US2016/068577, 16 pages.
International Search Report and Written Opinion dated Sep. 22, 2017, issued in International Application No. PCT/US2017/029187, 20 pages.
Office Action for U.S. Appl. No. 15/389,157, dated Oct. 6, 2017, 18 pages.
U.S. Appl. No. 15/849,383, filed Dec. 20, 2017, Enquist et al.
U.S. Appl. No. 15/856,391, filed Dec. 28, 2017, Haba et al.
U.S. Appl. No. 15/940,273, filed Mar. 29, 2018, Huang et al.

* cited by examiner

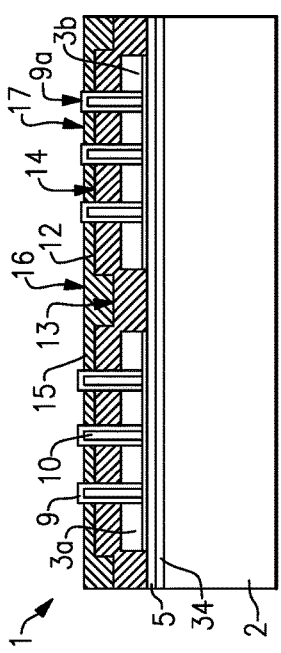
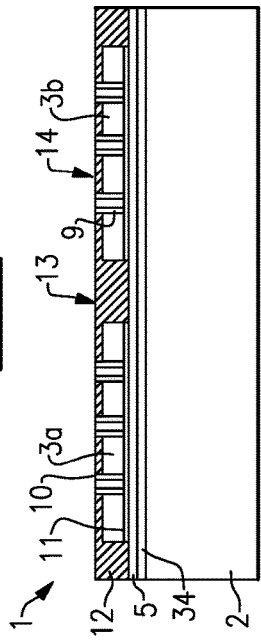
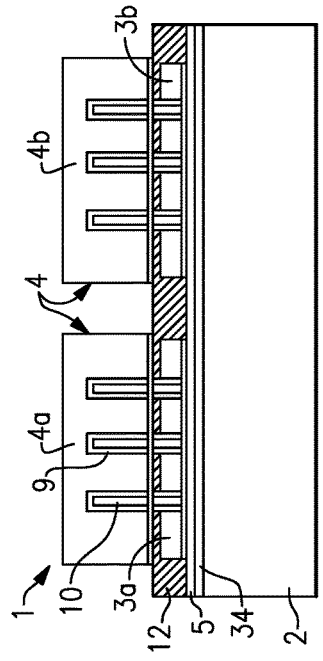
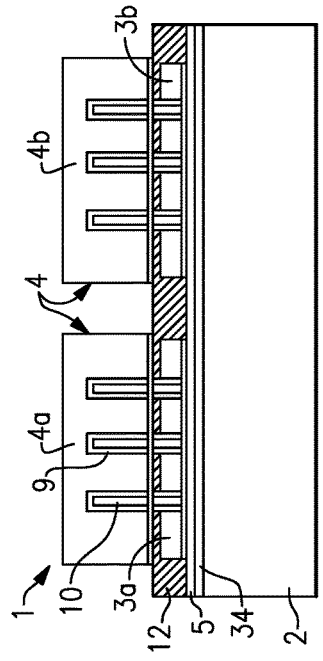
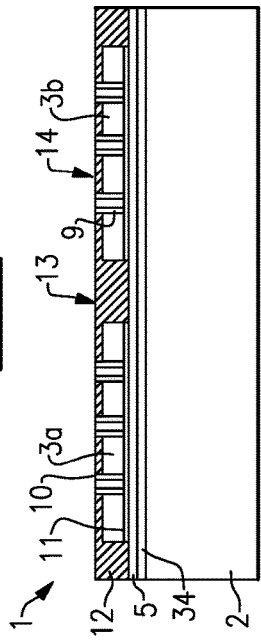
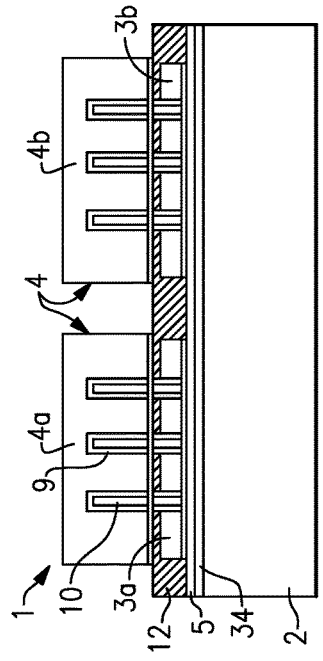

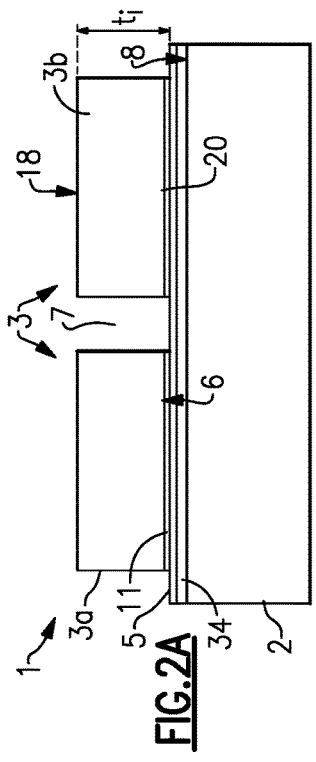
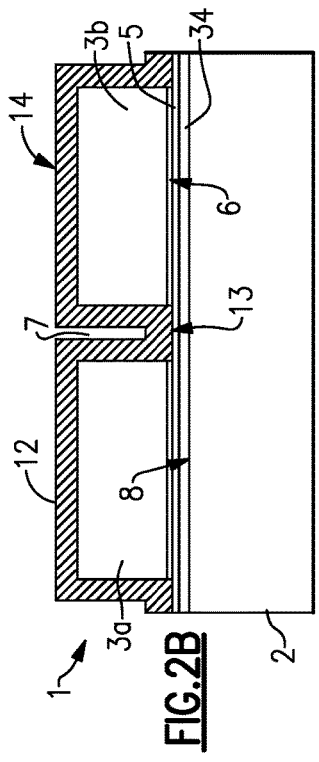
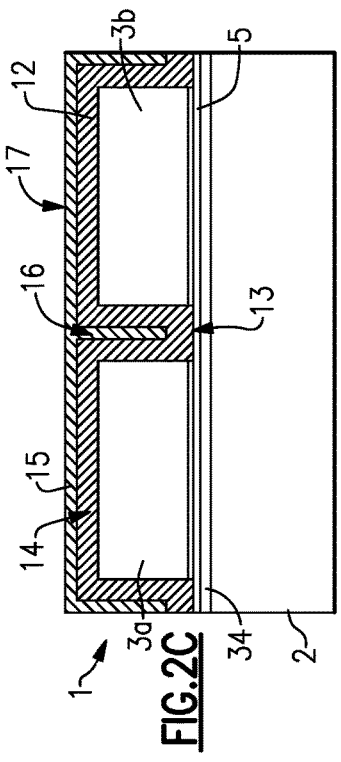
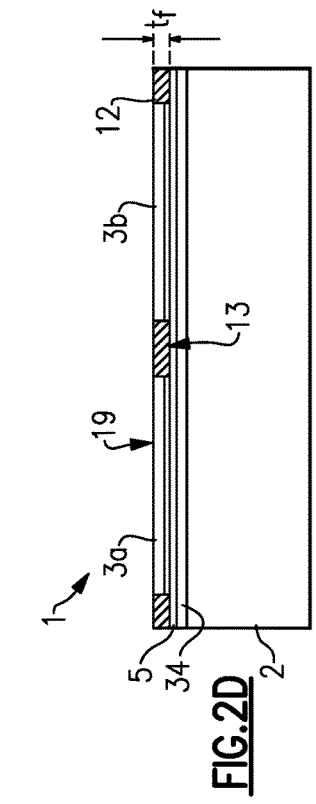
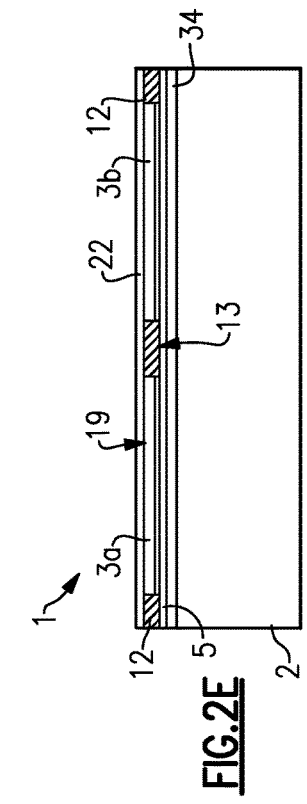
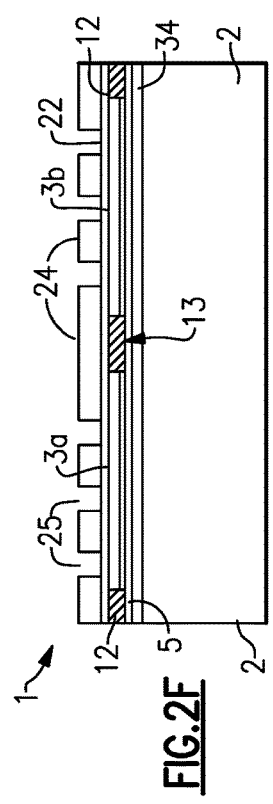

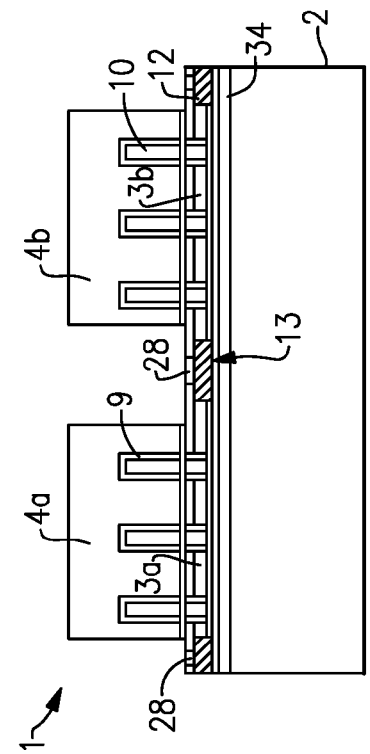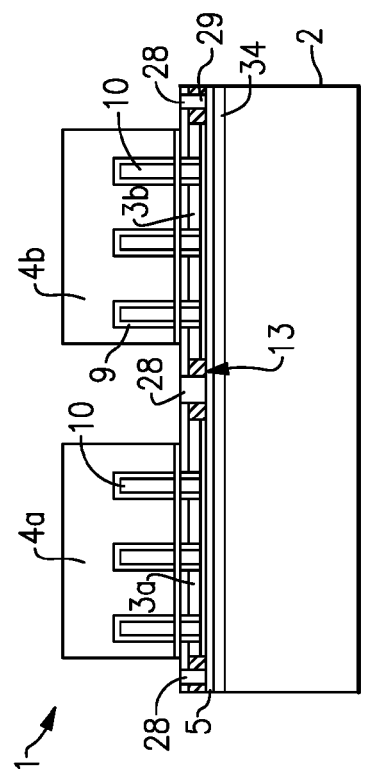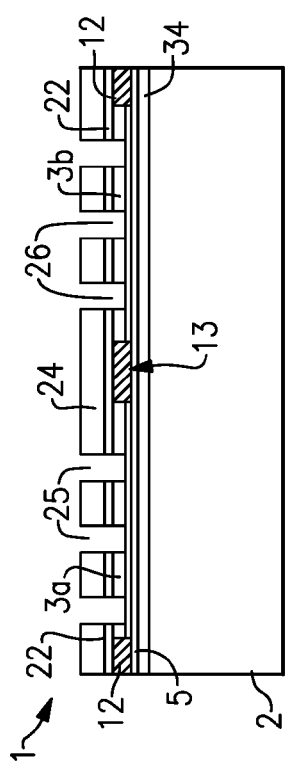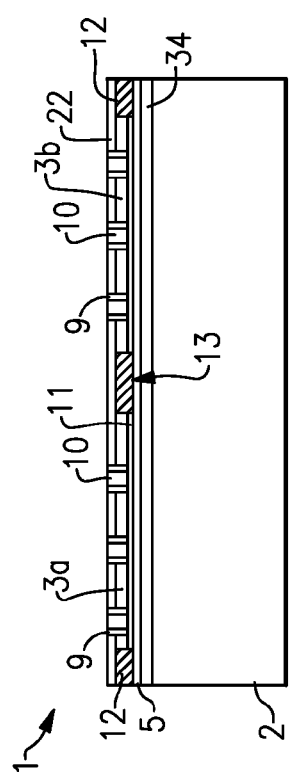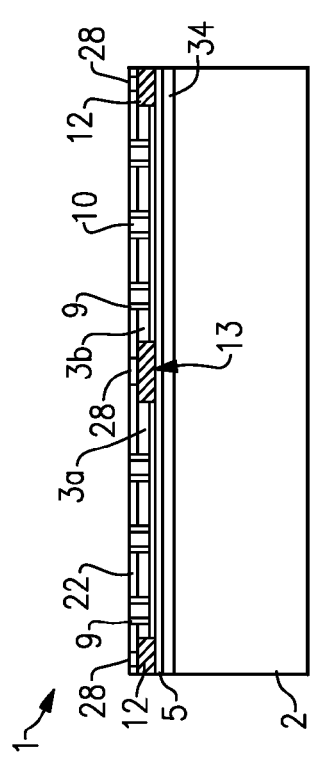

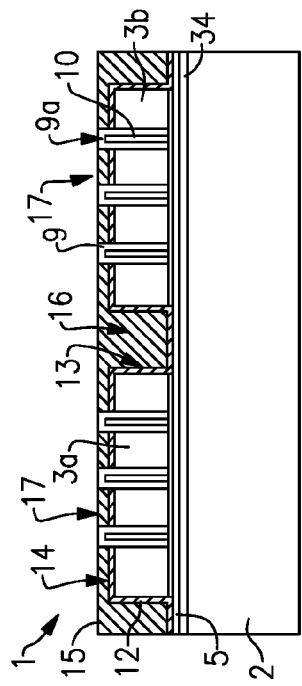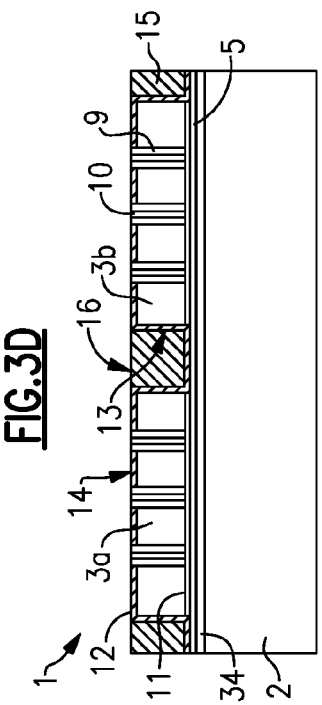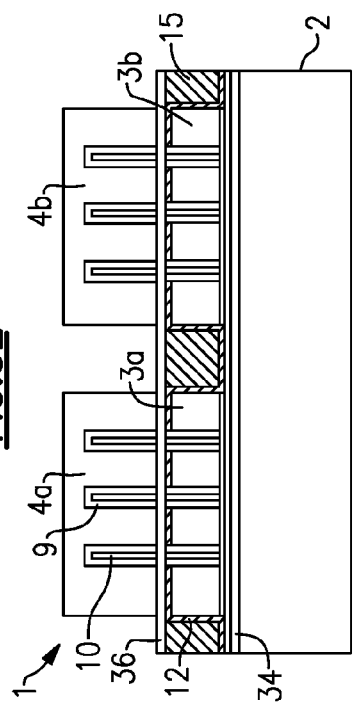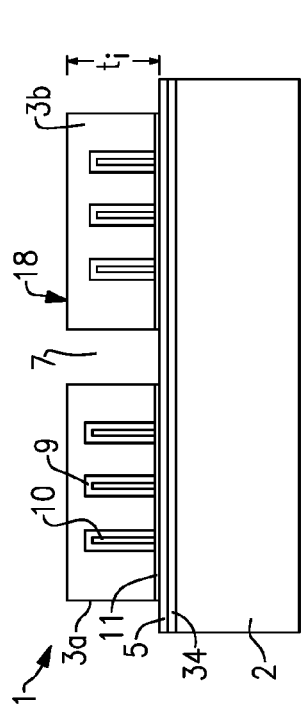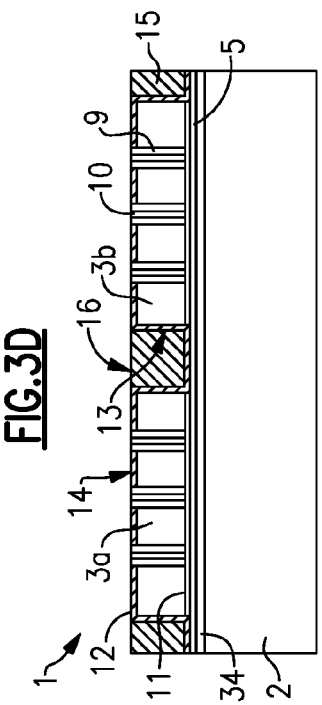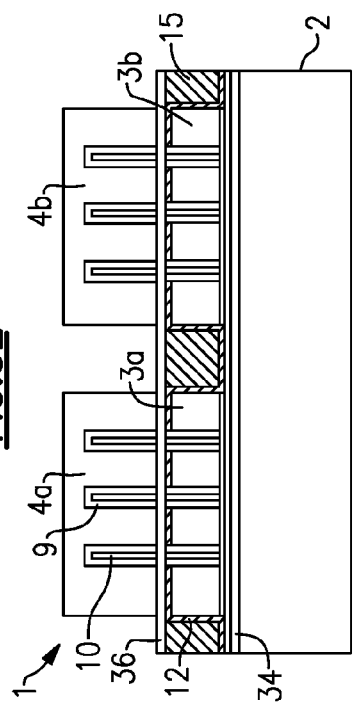

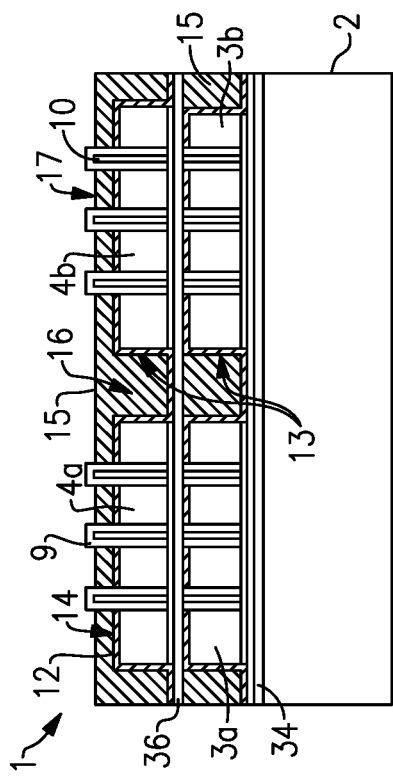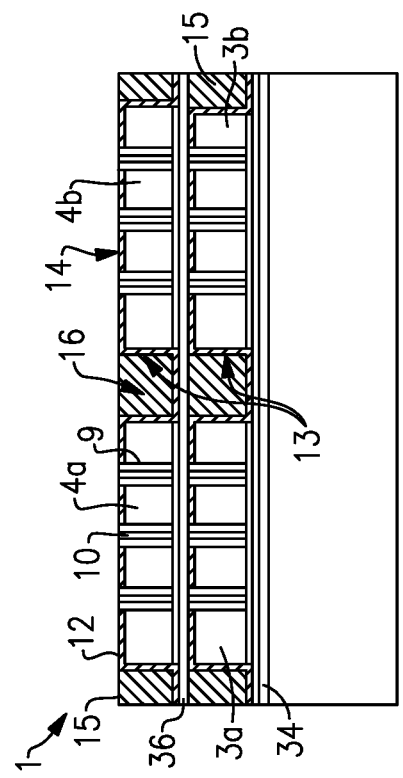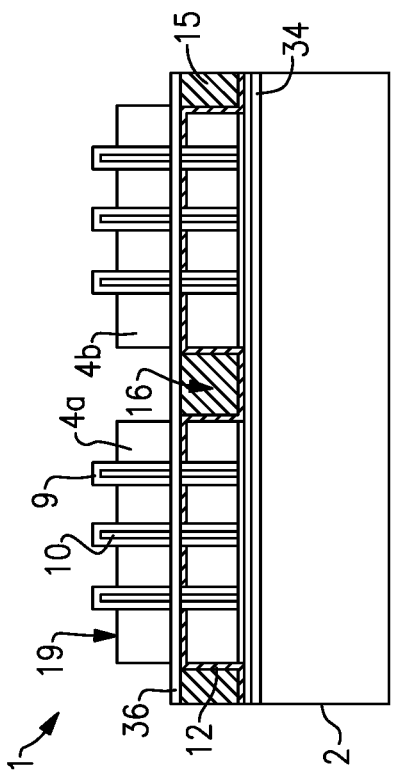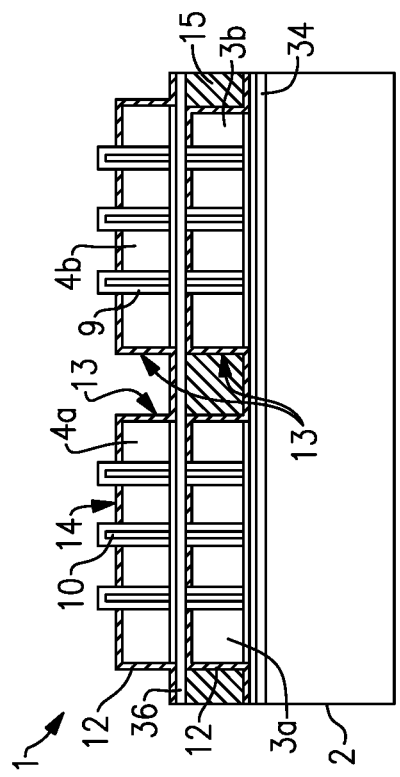
FIG. 3G
FIG. 3H
FIG. 3I
FIG. 3J

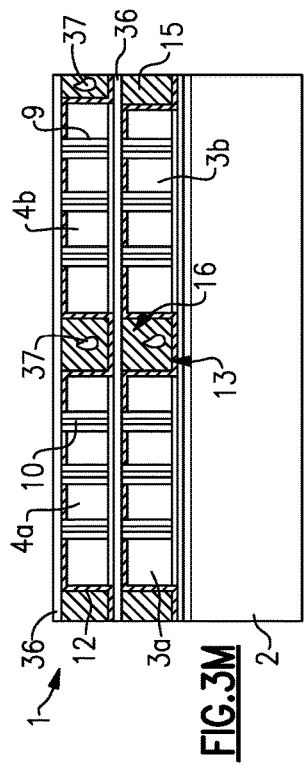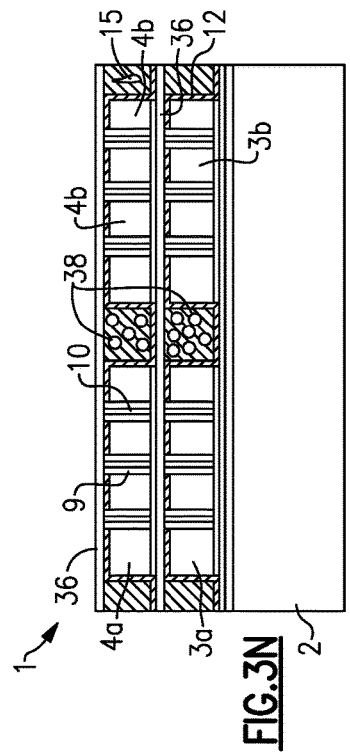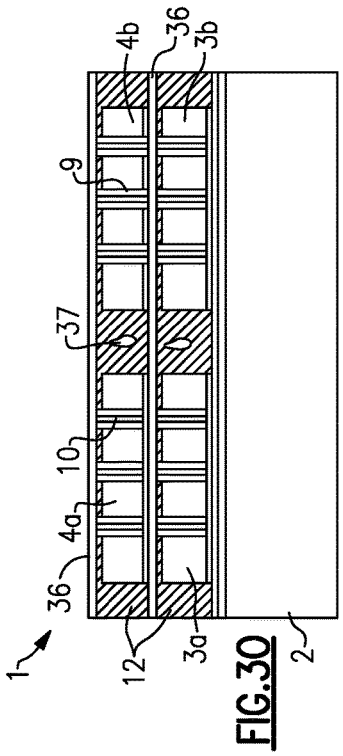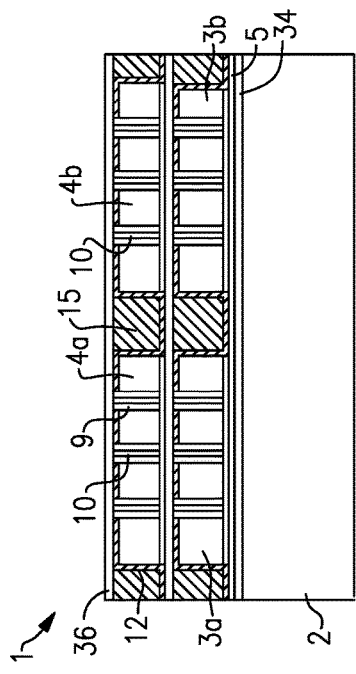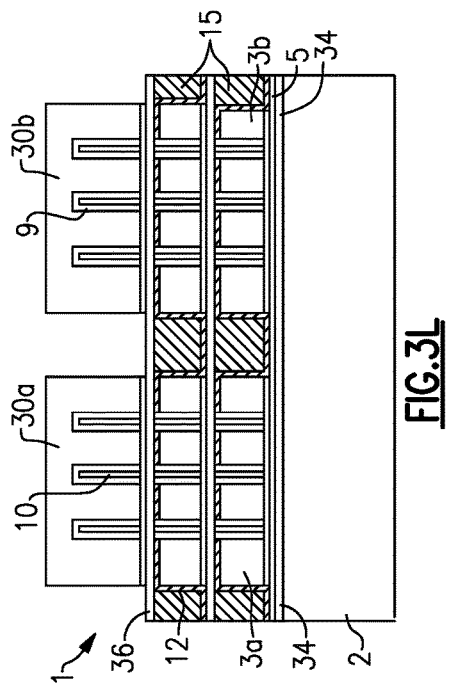

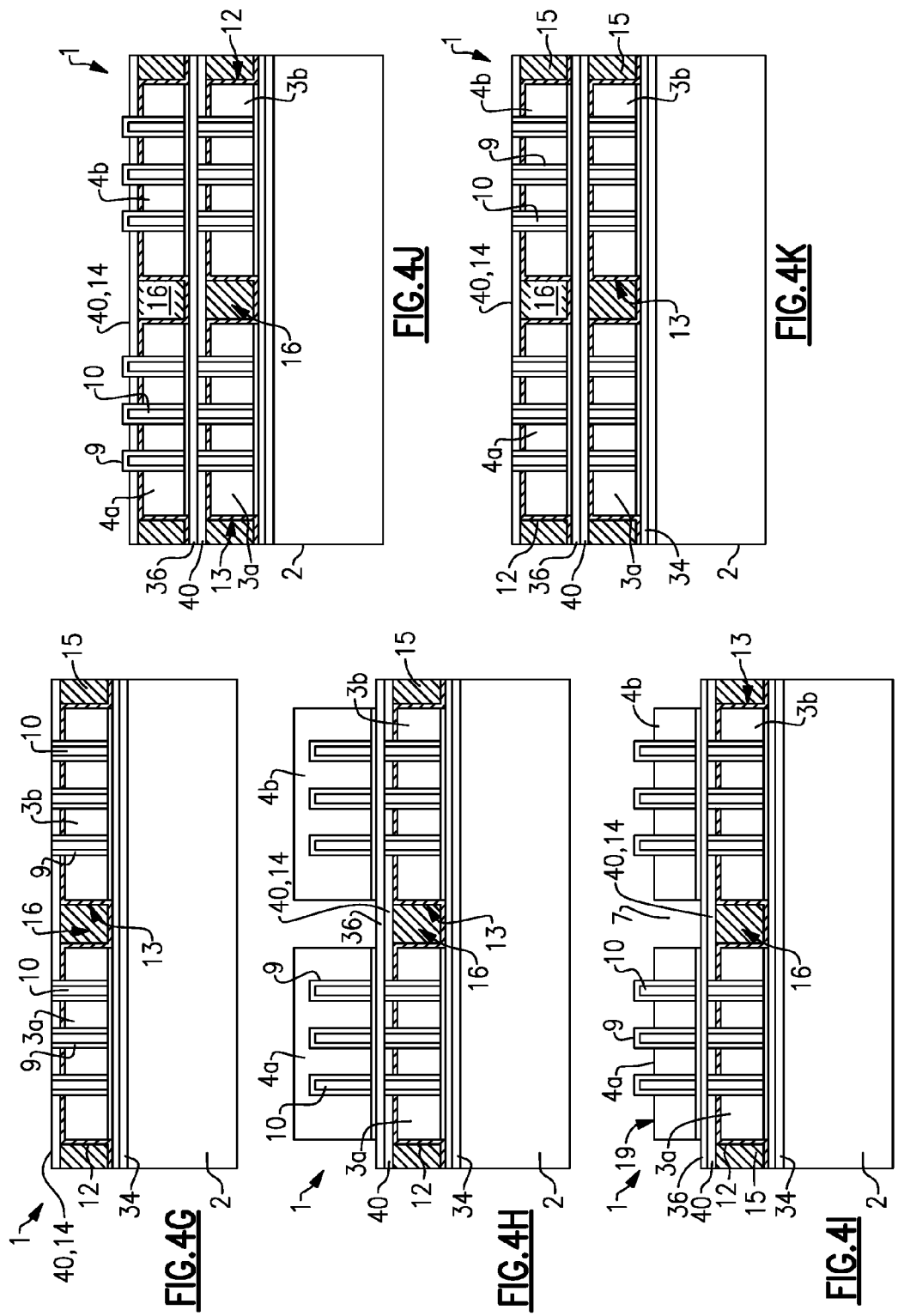

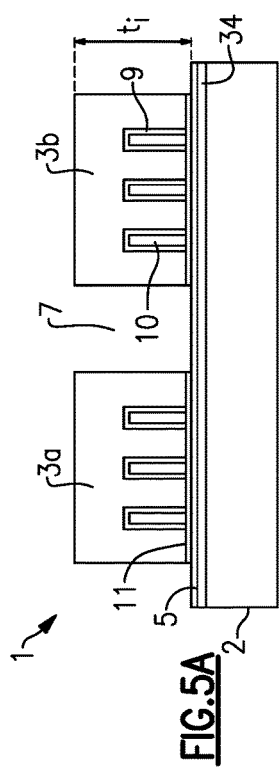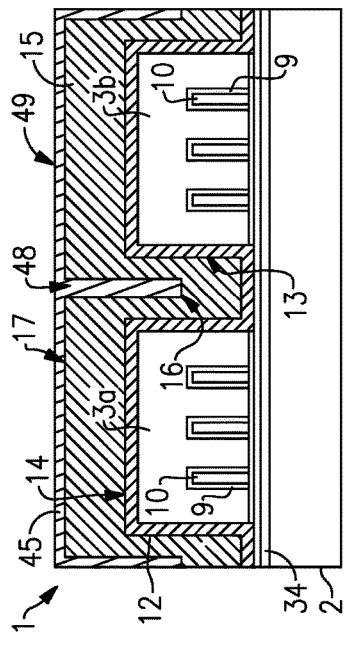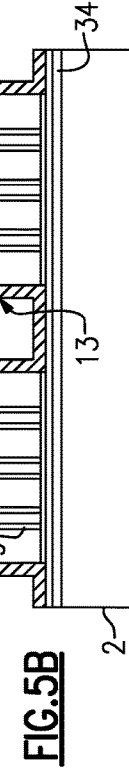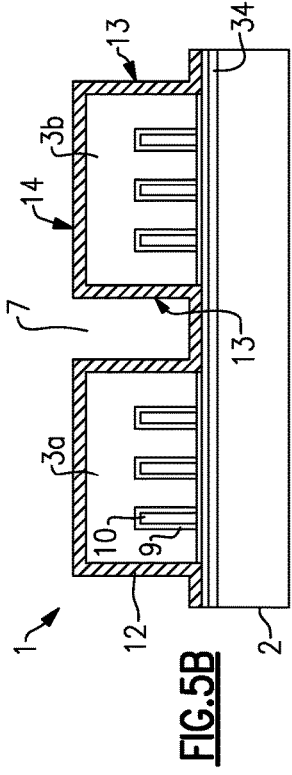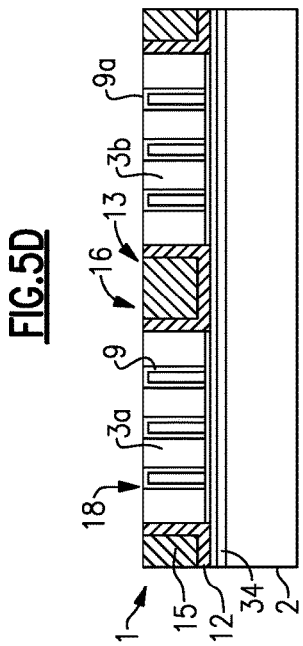

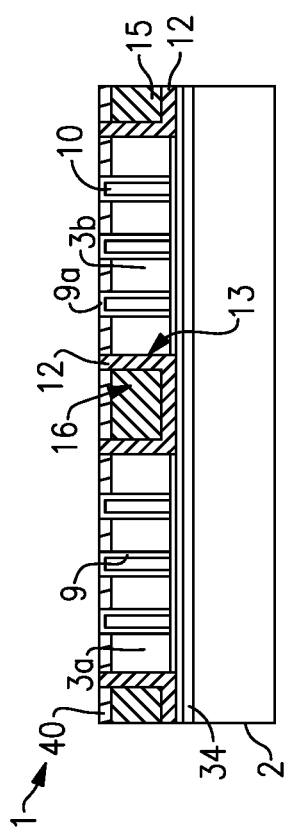
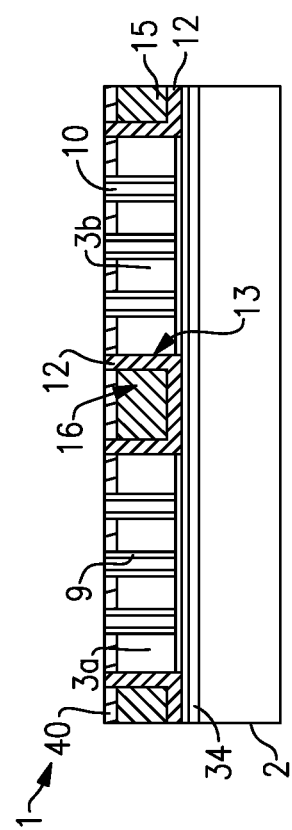
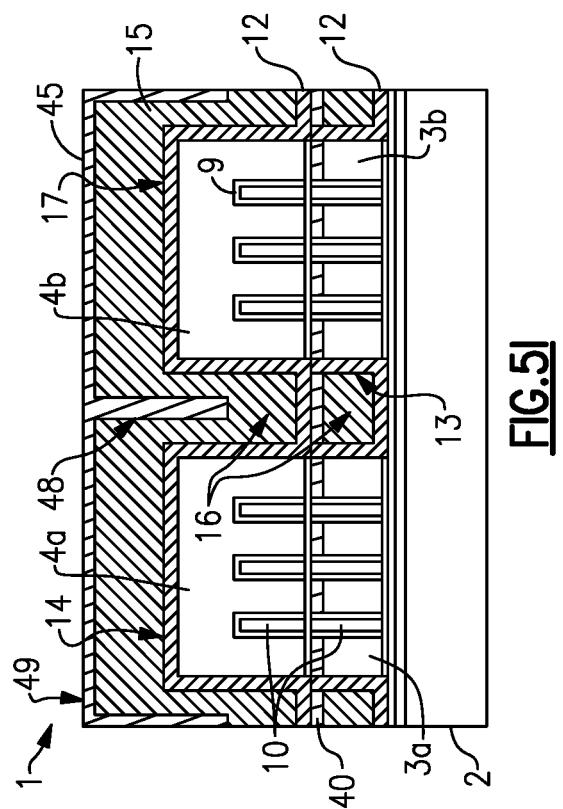

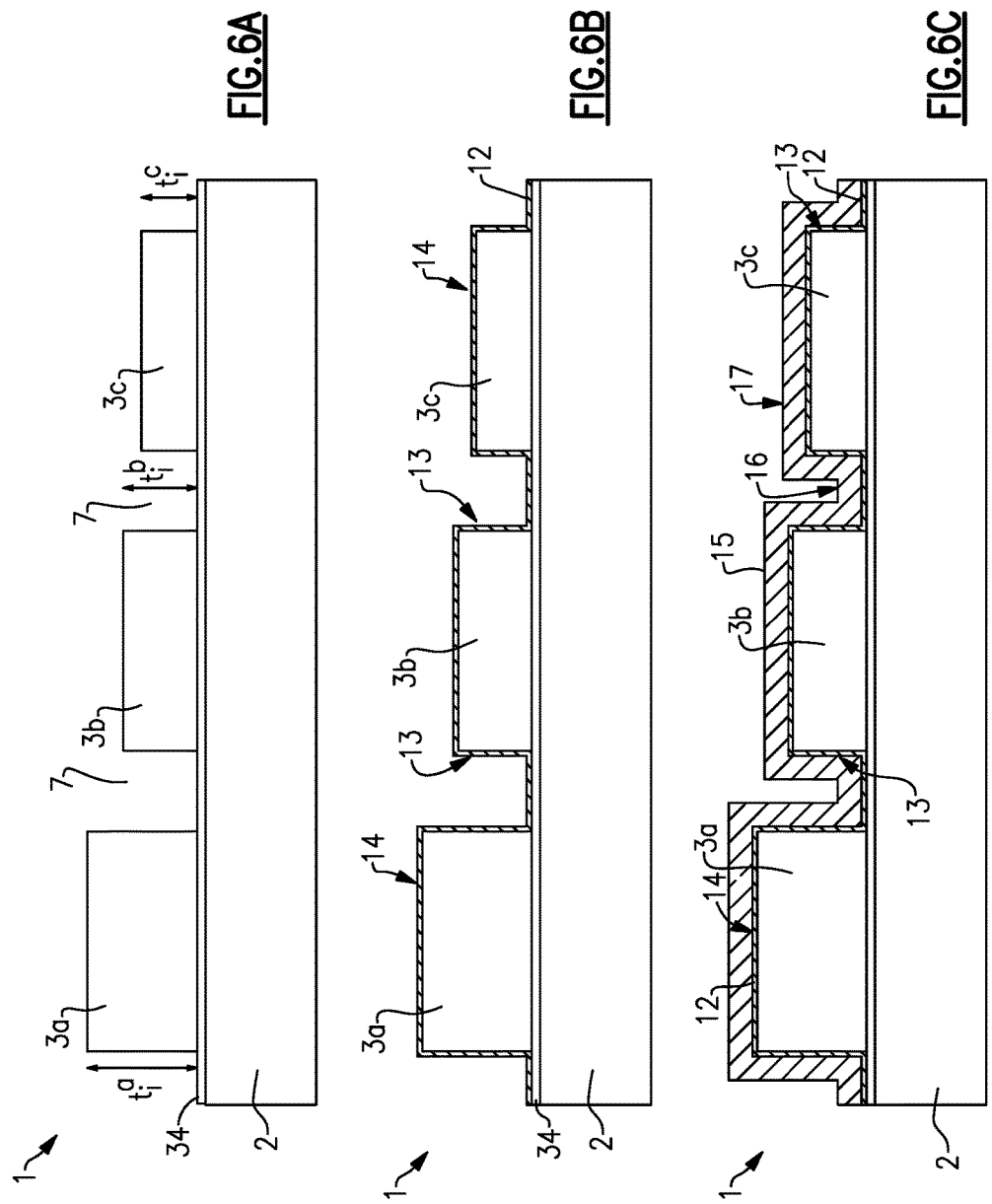

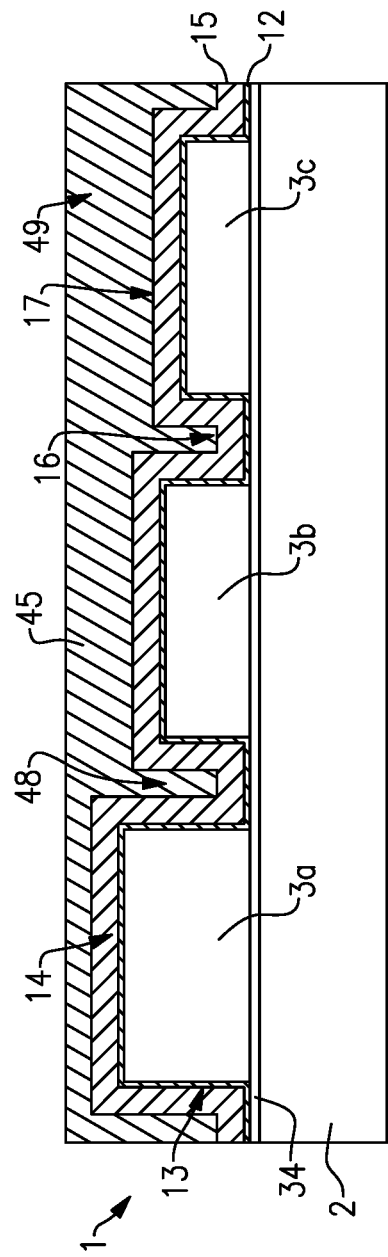
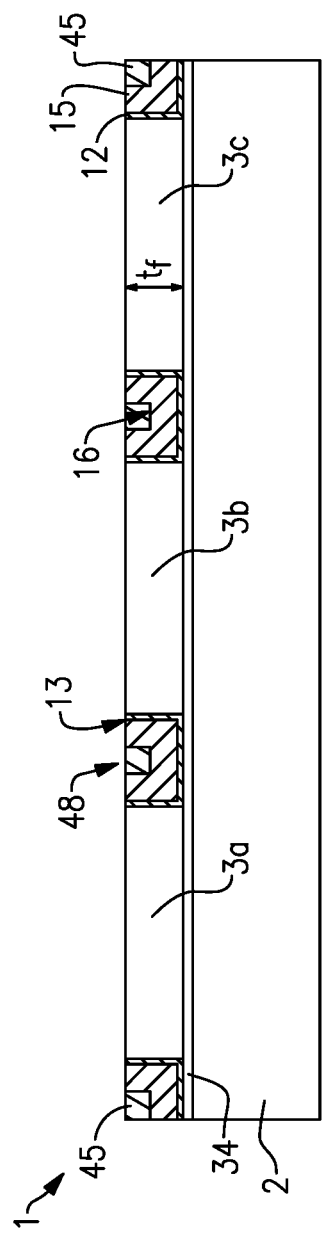
FIG.6D
FIG.6E

STACKED DIES AND METHODS FOR FORMING BONDED STRUCTURES

BACKGROUND

Field

The field relates to bonded structures with a protective material and methods for forming bonded structures with a protective material.

Description of the Related Art

In various packaging arrangements, it can be advantageous to provide thinned integrated device dies, e.g., to enable the use of multiple integrated device dies within a low-profile package. For example, three-dimensional (3D) integration techniques often utilize packages in which two or more integrated device dies are stacked on top of and electrically connected to one another. Conventional methods for die thinning and/or 3D integration may have limited product yield because stresses imparted to the dies during assembly may damage dies in the stack. Moreover, it can be challenging to stack dies which have different thicknesses and which may originate from different types of substrates and/or wafers. Accordingly, there remains a continuing need for improved systems and methods for stacking integrated device dies.

BRIEF DESCRIPTION OF THE DRAWINGS

These aspects and others will be apparent from the following description of preferred embodiments and the accompanying drawing, which is meant to illustrate and not to limit the invention, wherein:

FIGS. 1A-1F are schematic side cross-sectional views of various stages of a method for forming a bonded structure with a protective material, according to one embodiment.

FIGS. 2A-2K are schematic side cross-sectional views of various stages of a method for forming a bonded structure with a protective material, in which electrical interconnects are formed after thinning, according to another embodiment.

FIGS. 3A-3O are schematic side cross-sectional views of various stages of a method for forming a bonded structure in which a protective material during processing comprises a thin protective liner and a filler material, according to another embodiment.

FIGS. 4A-4K are schematic side cross-sectional views of various stages of a method for forming a bonded structure in which a protective material comprises an additional protective layer over the filler material, according to yet another embodiment.

FIGS. 5A-5I are schematic side cross-sectional views of various stages of a method for forming a bonded structure in which multiple layers are provided as protective material during fabrication, according to another embodiment.

FIGS. 6A-6E are schematic side cross-sectional views of various stages of a method for forming a bonded structure with multiple dies which have different initial thicknesses.

DETAILED DESCRIPTION

Figure 4A:
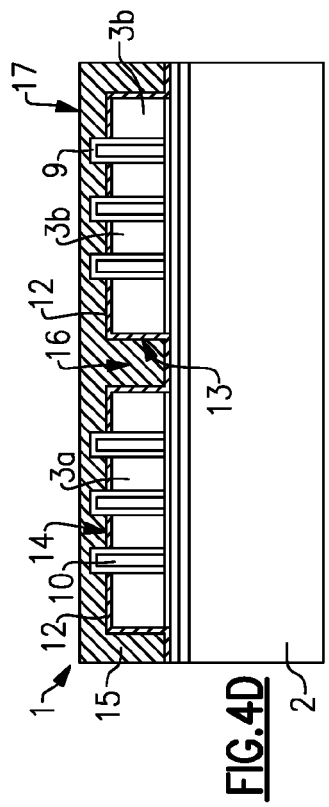

Various embodiments disclosed herein enable singulated integrated device dies to be mounted to a packaging structure (e.g., a package substrate, a wafer, another integrated device die, etc.) and to be thinned after mounting. Thinning the singulated integrated device die can aid in various aspects of package assembly, including, e.g., exposing or forming interconnects (such as through-silicon vias or TSVs). However, thinning the die by polishing or grinding may induce stresses in the die, which may damage or break edges of the die. In some embodiments, a protective material (which may comprise one or more protective layers) can be applied over and/or around the integrated device die to protect the die during thinning and, in some arrangements, during subsequent processing steps.

Moreover, various embodiments disclosed herein facilitate the efficient stacking of integrated device dies with an improved yield and reduced damage and stresses imparted to the dies. Integrated device packages and larger electronic systems may incorporate different types of integrated device dies, e.g., dies that have different functionality, dies that are formed of different material sets, and/or dies that have different thicknesses. It can be challenging to incorporate such diverse integrated device dies into a package, and/or to arrange different types of dies in a stacked relationship. For example, it may be difficult to bond two dies that are formed of, or are coated with, different materials. The material mismatch may introduce thermal and/or chemical bonding challenges for the stacked dies. Moreover, stacking dies with different thicknesses may unnecessarily increase the overall package height and/or may involve alignment challenges. Advantageously, the embodiments disclosed herein also enable the stacking of integrated device dies which have arbitrary initial thicknesses.

Accordingly, in various embodiments, a first integrated device die can be mounted to a carrier, such as a substrate (e.g., a wafer, a printed circuit board, flat panel, glass surface, surface comprising a dielectric layer, surface comprising a conductive layer or sections etc.). After mounting the first die to the carrier, the first integrated device die can be thinned. Advantageously, the first integrated device die, and subsequent dies, can be thinned on the carrier to a desired thickness. In various embodiments, the thinned die(s) can be made ultra-thin which can reduce the overall package height and enable the use of numerous dies within a particular die stack. Thinning can also facilitate exposing previously formed interconnects, or forming interconnects after thinning, such as through silicon vias (TSVs). In some arrangements, multiple dies can be mounted adjacent one another on the carrier and can be thinned using a grinding process, a polishing process, an etching process, or any other suitable process. In some arrangements, for example, when multiple adjacent dies are thinned and/or planarized by grinding, the edges of the dies may be subjected to stresses which can cause the edges of the dies to break, crack, or otherwise be damaged. To reduce incidence of die edge loss, additional materials from the die edge may be removed by low stress removal methods such as wet etch or dry etch or combinations thereof.

In some embodiments, the first integrated device die (and adjacent device dies) can be thinned with an etching process. Thinning can expose interconnects (e.g., through silicon vias, traces, contact pads, etc.) useful for electrically connecting stacked dies, or can facilitate formation of such interconnects. The first die disposed on the carrier can be coated with a protective material, including a first protective layer which acts to protect the die (including the die edges) during a grinding or polishing operation. In some embodiments, a second layer can be provided over the first layer to fill lateral gaps in the first layer. At least a portion of the second layer and the first layer can be removed. Removal of the portions of the second layer and the first layer can expose one or more electrical interconnects formed through the first integrated device die. A second integrated device die can be stacked on the first integrated device die. In some embodiments, non-conductive regions of the second die are directly bonded to corresponding non-conductive regions of the first die without an intervening adhesive. In some embodiments, both non-conductive regions and electrical interconnects of the second die are directly bonded to corresponding non-conductive regions and electrical interconnects, respectively, of the first die without an intervening adhesive.

FIGS. 1A-1F are schematic side cross-sectional views of various stages of a method for forming a bonded structure 1, according to one embodiment. In FIG. 1A, one or more first integrated device dies 3 (which can comprise first dies 3a, 3b) can be mounted to a carrier comprising a substrate 2. The substrate 2 can comprise any suitable type of substrate or interposer. For example, in some embodiments, the substrate 2 can comprise a silicon substrate (e.g., part or all of a wafer), a glass substrate, or silicon on insulator (SOI) substrate. The use of silicon, glass, or other semiconductor material for the substrate 2 can advantageously enable an upper surface 8 of the substrate 2 to be polished to a very low surface roughness so that the first dies 3a, 3b can be directly bonded to the substrate 2. Such a silicon substrate 2 may take the form of an interposer, for example. In other embodiments, however, the substrate 2 can comprise a printed circuit board (PCB), a ceramic substrate, a polymer substrate, or any other suitable substrate, and may or may not have an adhesive layer between the substrate and the device die(s). Although the carrier shown in FIGS. 1A-1F comprises a substrate, in other embodiments, the carrier to which the dies 3 are mounted can comprise one or more device dies, an optical device, or any suitable active or passive device.

The first integrated device die(s) 3 can comprise any suitable type of device die. For example, each of the first die(s) 3a, 3b can comprise a processor die, a memory die, a microelectromechanical systems (MEMS) die, a passive component, an optical device, or any other suitable type of device die. Circuitry (such as active components like transistors) can be patterned at or near active surfaces 6 of the die(s) 3a, 3b in various embodiments. The active surfaces 6 may be on a side of the dies 3a, 3b which is opposite respective backsides 18 of the dies 3a, 3b. The backsides 18 may or may not include any active circuitry or passive devices. The first dies 3a, 3b may be the same type of integrated device die or a different type of device die. As shown in FIG. 1A, the die 3a may be laterally spaced apart from the die 3b along the surface of the substrate 2 by a gap 7. In one embodiment, the spacing 7 between adjacent dies is comparable to the thickness of the said dies 3a or 3b. In other embodiments, the spacing 7 between adjacent dies is less than 10 times the thickness of dies 3a or 3b, e.g., preferably less than 5 times the thickness of dies 3a or 3b. In another embodiment, the gap 7 between adjacent dies may be less than one of the lateral dimensions of the dies. Although only two dies 3a, 3b are shown in FIG. 1A, it should be appreciated that more or fewer than two dies 3a, 3b may be mounted to the substrate 2. Further, in some embodiments, the dies 3a, 3b may be tested for appropriate electrical functionality before mounting the dies 3a, 3b to the substrate 2. In some embodiments, only known good dies (KGDs) may be selected for mounting to the substrate 2. In other embodiments, the dies may be tested for electrical functionality after being mounted to the substrate 2. The dies 3a, 3b of FIG. 1A comprise integrated device dies having various active (and/or passive) components. In other embodiments, one or more discrete passive devices may be mounted to the substrate without being formed as part of an integrated device die.

Conductive elements can be provided in one or more layers on the upper surface 8 of the substrate 2 to provide electrical connection to other devices and/or routing to other components within the substrate 2. In some embodiments, the one or more layers can comprise a routing layer 34 and a buffer layer 5, as shown in FIG. 1A. The routing layer 34 may comprise a redistribution layer (RDL) or a back end of line (BEOL) layer. For example, in various embodiments, the routing layer 34 can comprise copper, gold, aluminum, indium, gallium, tin, nickel, their respective alloys or any other suitable conductive material. The routing layer 34 may be patterned to direct electrical signals across the substrate 2 between various circuit elements, and/or between circuit elements and the larger electronic system to which the substrate 2 is connected. For example, in some embodiments, the routing layer 34 can comprise a BEOL dielectric layer with embedded and patterned metallic traces. The layer 34 can comprise one layer or multiple layers in various embodiments. The buffer layer 5 may be provided over the routing layer 34 between the substrate 2 and the first device dies 3a, 3b. The buffer layer 5 may comprise a non-conductive layer, such as a polymer layer (e.g., polyimide or oxide). In various embodiments, the buffer layer 5 can comprise a single layer or multiple layers. The buffer layer 5 may be relatively compliant so as to provide a cushion between the dies 3a, 3b and the substrate 2 to account for mechanical and/or thermal mismatch. The buffer layer 5 may have a thickness in a range of 1 micron to 10 microns, or in a range of 3 microns to 6 micron, e.g., in a range of 4 microns to 5 microns. It should be appreciated that although two layers (e.g., the buffer layer 5 and the routing layer 34) are illustrated in FIG. 1A, in some embodiments, only one layer may be used which includes conductive elements (which may be embedded in an insulating material).

One or more electrical interconnects 10 may be formed through at least a portion of each first die 3a, 3b. Each interconnect 10 may be formed inside a non-conductive liner 9. In various embodiments, the interconnects 10 and liners 9 may be formed using a damascene process in which one or more cavities are formed, and the liners 9 and interconnects 10 can be deposited in the cavities (e.g., trenches). In various embodiments, the interconnects 10 can comprise through substrate vias (TSVs), traces, or both. In some embodiments, the interconnects 10 can comprise traces or contact pads which are exposed at the surface of the dies 3a, 3b. As shown in FIG. 1A, the first dies 3a, 3b can be manufactured such that the interconnects 10 extend from the active surfaces 6 through a portion of an initial thickness $t_i$ of the first dies 3a, 3b. In FIG. 1A, the interconnects 10 are illustrated as not extending all the way to backsides 18 of the first dies 3a, 3b, although in other embodiments, the interconnects 10 may extend to the backsides 18. The interconnects 10 can be electrically connected to circuit elements formed at or near the active surfaces 6 of the dies 3a, 3b. The interconnects 10 can electrically couple with corresponding pads or traces in the buffer layer 5 and/or the routing layer 34 of the substrate 2.

Advantageously, the methods disclosed herein can be utilized with dies 3a, 3b that have any suitable initial thickness $t_i$, including thin dies, thick dies, intermediate-size dies, or any other arbitrary die thickness. Moreover, although the dies 3a, 3b shown in FIG. 1A have approximately the same initial thickness $t_i$, in some embodiments, the initial thicknesses $t_i$ of the adjacent dies 3a, 3b may differ. For example, in some embodiments, the initial thickness $t_i$ of the dies 3a, 3b can be in a range of 3 microns to 2000 microns, or more particularly, in a range of 5 microns to 200 microns, or more particularly, in a range of 5 microns to 100 microns.

The first dies 3a, 3b can be attached to the substrate 2 using any suitable method. For example, in the illustrated embodiment, the first dies 3a, 3b can be directly bonded to the substrate 2 without an intervening adhesive. In direct bonding arrangements, non-conductive field regions 20 of the dies 3a, 3b can directly contact and be directly bonded with corresponding non-conductive regions of the substrate 2. The bond pads or traces at the active surfaces 6, such as those connected to conductive interconnects 10, can contact and be directly bonded to corresponding metallic pads (or traces or other conducting features) of the routing layer 34, which may be exposed through openings in the buffer layer 5, and may protrude or be recessed.

In some embodiments, some or all of the bond pads or traces at the active surfaces 6, such as those connected to conductive interconnects 10, can be directly bonded to non-conductive features of the routing layer 34. In such embodiments, in subsequent steps, the substrate 2 can be thinned from the backside and conductive contacts can be formed from the thinned substrate 2 to electrically couple to the conductive bond pads or traces on the active surface of the dies 3a and/or 3b. In other embodiments, the dies 3a, 3b can be adhered to the substrate 2 with any suitable adhesive, such as solder, a conductive epoxy, anisotropic conductive film, etc.

To accomplish the direct bonding, in some embodiments, the bonding surfaces of the dies 3a, 3b and the substrate 2 can be prepared for bonding. The first dies 3a, 3b can be polished to a very high degree of smoothness (e.g., less than 20 nm surface roughness, or more particularly, less than 5 nm surface roughness). In some embodiments, a bonding layer 11 (e.g., a dielectric such as silicon oxide) may be deposited on the active surfaces 6 of the dies 3a, 3b and polished to a very high degree of smoothness. Similarly, the bonding surface of the substrate 2 (e.g., the upper surface 8 of the substrate 2 or the upper surface of the buffer layer 5) may be polished to a very high degree of smoothness (e.g., less than 20 nm surface roughness, or more particularly, less than 5 nm surface roughness). In some embodiments, the bonding surfaces (e.g., the buffer layer 5, the upper surface 8 of the substrate 2, the bonding layer 11, and/or the active surface 6) may be fluorinated to improve bonding. The bonding surfaces may also include conductive features, such as bond pads. In some embodiments, the surfaces to be bonded may be terminated with a suitable species and activated prior to bonding. For example, in some embodiments, the surfaces to be bonded may be very lightly etched for activation and exposed to a nitrogen-containing solution and terminated with a nitrogen-containing species. As one example, the surfaces to be bonded may be exposed to an ammonia dip after a very slight etch, and/or a nitrogen-containing plasma (with or without a separate etch).

Once the surfaces are prepared, the nonconductive field regions 20 of the dies 3a, 3b can be brought into contact with corresponding nonconductive regions of the substrate 2. The interaction of the activated surfaces can cause the nonconductive regions 20 of the dies 3a, 3b to directly bond with the corresponding nonconductive regions of the substrate 2 without an intervening adhesive, without application of external pressure, without application of voltage, and at room temperature. In various embodiments, the bonding forces of the nonconductive regions can be covalent bonds that are greater than Van der Waals bonds and exert significant forces between the conductive features on the surface of dies 3a and the corresponding contact pads of the substrate 2. In some embodiments, the interconnects 10 and/or the contact pads are flush with the exterior surfaces of the dies 3a, 3b and the substrate 2. In other embodiments, the interconnects 10 and/or the contact pads may extend above the exterior surfaces of the dies 3a, 3b and the substrate 2. In still other embodiments, the interconnects 10 and/or the contact pads are recessed relative to the exterior surfaces (e.g., oxide field regions) of the dies 3a, 3b and the substrate 2. In various embodiments, the substrate 2 and dies 3a, 3b may be heated after bonding to strengthen the bonds between the nonconductive regions, between the conductive regions, and/or between opposing conductive and non-conductive regions, to cause the dies 3a, 3b to bond with the substrate 2. Additional details of the direct bonding processes may be found throughout U.S. Pat. Nos. 7,126,212; 8,153,505; 7,622,324; 7,602,070; 8,163,373; 8,389,378; and 8,735,219, and throughout U.S. patent application Ser. Nos. 14/835,379; 62/278,354; and 62/303,930, the contents of each of which are hereby incorporated by reference herein in their entirety and for all purposes.

Although the embodiment of FIG. 1A illustrates dies 3a, 3b which are directly bonded to the substrate 2, in other embodiments, the dies 3a, 3b may be mounted to the substrate 2 in other ways. For example, in other embodiments, the dies 3a, 3b may be connected to the substrate 2 with solder balls or other electrical contacts. In still other embodiments, the dies 3a, 3b may be connected with the substrate 2 with anisotropic conductive film or nonconductive paste.

Turning to FIG. 1B, the backsides 18 of the dies 3a, 3b are thinned from the initial thickness $t_i$, to a final thickness $t_f$ as defined between a back surface 19 and an opposing front surface of the dies 3a, 3b. For example, as shown in FIG. 1B, the backside 18 can be etched using a suitable etchant for a time period sufficient to expose the interconnects 10 and liners 9. In some embodiments, the dies 3a, 3b are etched using a silicon reactive ion etch (RIE) technique. Other types of thinning techniques may be used to thin the dies 3a, 3b. For example, other types of etching processes may be used, including anisotropic or isotropic etch techniques (e.g., dry or wet etch processes) that are known to those having skill in the art. The dies 3a, 3b can be thinned until the dies 3a, 3b have the desired final thickness $t_f$. Once thinned, the interconnects 10 and liners 9 may extend above and be exposed through an exposed back surface 19 of the first dies 3a, 3b. As shown in FIG. 1B, where selective silicon etching is employed, the distal, exposed end of the interconnects 10 may comprise a distal liner portion 9a of the liner 9, which corresponds to the portion of the liner 9 deposited in the bottom of the trench during damascene processing.

In various embodiments, the final thickness $t_f$ of the dies 3a, 3b may be less than 40 microns, less than 30 microns, or less than 20 microns. The final thickness $t_f$ of the dies 3a, 3b may be in a range of 5 microns to 30 microns, or more particularly, in a range of 5 microns to 15 microns, or more particularly, in a range of 5 microns to 10 microns. The final thickness $t_f$ of the dies 3a, 3b may be the same or may be different from one another. In various embodiments, the final thickness $t_f$ of the dies 3a, 3b may be less than 300 microns, less than 200 microns, or less than 100 microns. The final thickness $t_f$ of the dies 3a, 3b may be in a range of 40 to 100 microns in some embodiments.

Turning to FIG. 1C, a protective material can be provided over the first dies 3a, 3b and over portions of the substrate 2 between the adjacent dies 3a, 3b. In some embodiments, the protective material can comprise a first layer 12 deposited (e.g., with a plasma deposition process to facilitate lower temperatures) over the buffer layer 5 (or the upper surface 8 of the substrate 2 if there is no buffer layer) and over the back surface 19 of the dies 3a, 3b to coat the buffer layer 5 (or the upper surface 8 of the substrate 2 if there is no buffer layer) and the dies 3a, 3b. In other embodiments, the first layer 12 can be laminated on the substrate 2 and the dies 3a, 3b. In other embodiments, the first layer 12 may be deposited by slip casting methods, screen printing or coating or spin coating, 3D printing methods or by electrophoretic methods or combinations thereof. As shown in FIG. 1C, the first layer 12 can have a thickness $t_c$ which may be no less than the final thickness $t_f$ of the dies 3a, 3b. The thickness $t_c$ of the applied first layer 12 may be in a range of 0.5 microns to 50 microns, in a range of 1 micron to 35 microns, 5 microns to 30 microns, or more particularly, in a range of 2 microns to 25 microns, or more particularly, in a range of 5 microns to 15 microns, or in a range of 2 microns to 15 microns, or in a range of 5 microns to 10 microns. The thickness $t_c$ of the applied first layer 12 may be less than 40 microns, less than 30 microns, or less than 20 microns. Moreover, as shown in FIG. 1C, the first layer 12 can include a first portion 13 disposed in the gap 7 between the dies 3a, 3b and a second portion 14 disposed over the back surface 19 of the dies 3a, 3b. The second portion 14 can be disposed around and can surround the exposed electrical interconnects 10 and liners 9.

Advantageously, the first layer 12 can act as a protective layer to protect the dies 3a, 3b during subsequent processing steps. For example, as explained below in connection with FIG. 1E, the back side of the partially-formed bonded structure 1 can be planarized. The protective first layer 12 can advantageously protect the dies 3a, 3b (such as the die edges) during a removal operation, such as polishing, to prevent the edges and other portions of the dies 3a, 3b from breaking off or otherwise being damaged. Thus, the first layer 12 can effectively lock in and seal the dies 3a, 3b during subsequent processing steps to protect the structural integrity of the dies 3a, 3b.

The first layer 12 may be harder than the exposed back surface 19 of the dies 3a, 3b in some embodiments. The first layer 12 may be hard and dense compared to unfilled polyimide or epoxy resin coating so as to protect the dies 3a, 3b. For example, the first layer 12 can have a relatively high Young's modulus in a range of 12 GPa to 500 GPa, or more particularly, in a range of 20 GPa to 200 GPa. Beneficially, the first layer 12 can have a coefficient of thermal expansion which is substantially matched with the coefficient of thermal expansion of the substrate 2. Matching the thermal expansion coefficients can advantageously reduce thermally-induced stress on the dies 3a, 3b. In some embodiments, the coefficient of thermal expansion of the first layer 12 can be within 25 ppm/° C. of the coefficient of thermal expansion of the first dies 3a, 3b, or more particularly within 20 ppm/° C. of the coefficient of thermal expansion of the first dies 3a, 3b. For example, the coefficient of thermal expansion of the first layer 12 can be in a range of 0.3 ppm/° C. to 22 ppm/° C., in a range of 0.5 ppm/° C. to 15 ppm/° C., in a range of 2 ppm/° C. to 15 ppm/° C., or more particularly, in a range of 0.5 ppm/° C. to 12 ppm/° C., or more particularly, in a range of 2 ppm/° C. to 10 ppm/° C.

Moreover, it can be important to select the first layer 12 such that it has a sufficiently high glass transition temperature (GTT). Subsequent processing steps may involve heating the partially-formed structure 1 to high temperatures. For example, the structure 1 may be heated during processing of subsequent conductive layers (such as RDL layers) and/or during bonding to temperatures greater than 150° C., greater than 200° C., or greater than 250° C. Some polymers, epoxies, and other materials may soften significantly during such high temperature processing. It can be important to choose a material for the first layer 12 which can withstand high temperature processing and maintain its geometric profile and/or does not deform irreversibly during the various thermal processing steps. Thus, it can be advantageous to select a first layer 12 which has a high GTT, e.g., a GTT greater than 100° C., greater than 150° C., greater than 200° C., greater than 250° C., or greater than 300° C. In some embodiment, for a crosslinked material, the GTT of the first layer can be less than 100° C. provided that the Poisson ratio is greater than 0.4 and preferably close to 0.5, e.g., a Poisson ratio in a range of 0.25 to 0.8, and with a thermal decomposition temperature greater than 250° C., or greater than 300° C. In some embodiments, as explained herein, a polymer material can be used for the first layer 12 (and/or for additional protective layers such as the second layer 15 described below). The polymer material or matrix can have a melting point greater than 150° C., greater than 200° C., greater than 250° C., greater than 300° C., or greater than 350° C., e.g., greater than 280° C. in some embodiments.

Accordingly, it can be important to select a first layer 12 which is stiff and/or hard with a high Young's modulus, which has a coefficient of thermal expansion similar to that of the substrate (e.g., similar to that of silicon or glass in the case of silicon or glass substrates), and which has a glass transition temperature, or GTT, which exceeds the highest processing temperatures used to form the bonded structure 1. For example, in some embodiments, the first layer 12 can comprise silicon, inorganic oxide, inorganic nitride, inorganic carbide, or carbonate, for example, silicon oxide, silicon nitride, silicon carbide, diamond like carbon (DLC) or other types of semiconductor materials and non-semiconductor materials. In other embodiments, a polymer may be used. For example, the first layer 12 may comprise a polyimide or polyimide-amide. In some embodiments, the first layer 12 can comprise Torlon®. In some embodiments, as explained herein, the first layer 12 can comprise a base material (such as a polymer) that is filled with filler particles (such as oxide or nitride particles, carbonates, mica, treated or untreated kaolin, talc, or treated or untreated clay materials, for example, bentonite clay, etc.). The filler particles may assist in reducing the thermal expansion coefficient of layer 12 and rendering the CTE of layer 12 closer to that of the substrate 2. The filler particles may increase the hardness or stiffness of the layer 12. The filler content can vary between 10% to 90%, e.g., between 20% and 85%, or more particularly, between 30% and 80%. The filler particles may be sized in a range of 2 nm to less than 20 microns, e.g., between 50 nm and 5 microns. In one embodiment, the average size of the filler particulate is less than 30% of the gap 7 disposed between dies 3a and 3b. In other embodiments the average size of the filler particulate is less than 10% of the gap 7 between dies 3a and 3b, e.g., less than 2% of the gap 7 between dies 3a and 3b. In some embodiments, the average size of the filler particulate in the gap 7 is less than 30% of the final die thickness $t_f$; e.g., at least some of the filler particles are less than 5% of the final thickness $t_f$ of the die. In some embodiments, the width or length of a particulate on or adjacent to the vertical side wall of dies 3a or 3b is less than 15% of the final thickness $t_f$ of the dies 3a or 3b. Because the dies 3a, 3b have already been thinned in the illustrated embodiment, these materials may be used with the first layer 12 without introducing excessive stresses or excessive costs.

In FIG. 1D, a second layer 15 can be provided on the first layer 12. The second layer 15 may comprise a filler layer which fills spaces or gaps in the first layer 12 to facilitate planarization. The second filler layer 15 may comprise the types of particulates recited above for the first layer 12. As shown in FIG. 1D, the second layer 15 can comprise a third portion 16 disposed over the first portion 13 laterally between the second portions 14 of the first layer 12, which are provided over the back surfaces 19 of the first dies 3a, 3b. The second layer 15 can also include a fourth portion 17 disposed over the second portions 14 of the first layer 12. As shown in FIG. 1D, therefore, the second layer 15 can act as a planarizing layer which fills gaps of the first layer 12, and need not have the hardness or CTE characteristics noted above for the first layer 12. The second layer 15 can comprise any suitable material, such as a polymer (e.g., a hard baked, planarizing negative photoresist in some embodiments, or a slip cast or laminated planarizing layer).

Turning to FIG. 1E, a back side of the partially-formed structure 1 can be grinded and/or polished such that at least portions of the second layer 15 and at least portions of the first layer 12 are removed. For example, the structure 1 can be etched or polished back, e.g., using a chemical-mechanical polishing (CMP) technique, a mechanically milling technique, a grinding technique, or removed with, e.g., wet laser ablation methods and combinations thereof. In the embodiment of FIG. 1E, for example, the second layer 15 can be mostly or entirely removed. The process can be selected to stop on the first layer 12. Accordingly, only part of the first layer 12 can be removed such that at least some of the first portion 13 of the first layer 12 remains disposed in the gap 7 between the dies 3a, 3b, and at least some of the second portion 14 of the first layer 12 remains disposed over the dies 3a, 3b.

As shown in FIG. 1E, the removal step can expose the distal end of the conductive interconnect 10 by removing the distal portion 9a of the liner 9 which is at the distal end of the interconnect 10. In FIG. 1E, the end of the interconnect 10 can extend slightly above the dies 3a, 3b. Advantageously, the removal step of FIG. 1E can leave at least a thin layer of the second portion 14 of the first layer 12 over the dies 3a, 3b. The remaining second portion 14 can beneficially prevent the interconnect 10 from smearing onto the dies 3a, 3b during planarization. The exposed surfaces of the first layer 12 (e.g., the exposed surfaces of the first portion 13 and the second portion 14), the liner 9, and the interconnect 10 may be prepared for direct bonding as explained above.

In FIG. 1F, one or more second dies 4 (such as dies 4a, 4b) can be stacked on and electrically connected to the first dies 3a, 3b. As explained above, bonding surfaces of the first dies 3a, 3b and bonding surfaces of the second dies 4a, 4b can be prepared for direct bonding. For example, the bonding surfaces can be polished to a high degree of smoothness, activated with a suitable species. Nonconductive regions of the second dies 4a, 4b can be brought into contact with corresponding nonconductive regions of the first dies 3a, 3b to directly bond the second dies 4a, 4b to the first dies 3a, 3b. The forces that bond the nonconductive regions with covalent bonds may induce internal forces between conducting features on the surface of the second dies 4a, 4b and corresponding conductive features on the backside of the first dies 3a, 3b, which may cause the corresponding conductive features to bond together. In some embodiments, for example, contact pads on the second dies 4 can be directly bonding with corresponding contact pads on the first dies 3. The contact pads may be connected with (and/or may form part of) the interconnects 10. A subsequent annealing treatment may strengthen the bond between the respective conductive interconnect features and nonconductive regions of the second dies 4a, 4b and the first dies 3a, 3b. In some embodiments, the interconnects 10 of each die 3a, 3b, 4a, 4b can electrically connect (e.g., by direct bonding or by adhesive techniques) with a redistribution layer or BEOL by way of traces that provide electrical connection between the interconnects 10 of the first dies 3a, 3b and the interconnects 10 of the second dies 4a, 4b.

The resulting bonded structure 1 can therefore include one or more second dies 4a, 4b directly bonded to one or more first dies 3a, 3b without intervening adhesives, which in turn are directly bonded to the substrate 2. In some embodiments, respective interconnects 10 of the first dies 3a, 3b and second dies 4a, 4b may also be directly bonded together. The interconnects 10 may comprise a through silicon via (TSV) formed in the dies 3-4 and contact pads at the active surfaces 6 of the dies. A first portion 13 of the first layer 12 may be disposed laterally between the first dies 3a, 3b. The first portion 13 of the first layer may be disposed on a side surface of the first dies 3a, 3b. A second portion 14 of the first layer 12 may be disposed vertically between the first die 3a and the second die 4a, and between the first die 3b and the second die 4b. The second portion 14 of the first layer 12 may be laterally disposed around the electrical interconnects 10 such that the electrical interconnects 10 are exposed through the layer 12. In some embodiments, the stacked dies 3, 4 may be packaged together in an integrated device package after assembly. In other embodiments, the two stacked dies 3, 4 may be singulated and packaged in separate integrated device packages.

Moreover, although not shown in FIGS. 1A-1F, it should be appreciated that the process depicted in FIGS. 1A-1F may be repeated any suitable number of times so that additional integrated device dies may be stacked on top of the dies 4a, 4b. Any suitable number and/or type of integrated device dies may be stacked to define the bonded structure 1. For example, the integrated device dies 3a, 3b, 4a, 4b may comprise active and/or passive electronic components. In some embodiments, one or more passive interposers may connect dies on opposing sides of the interposer. In some embodiments, the structure 1 can include a spacer, a heat spreader, or other components with limited electrical functionality. In some embodiments, one or more interconnects can be used for electrical shielding purposes, e.g., as forming part of a Faraday cage structure. The thinned dies described herein can present a lower profile for an integrated circuit package, and also reduce the overall resistance of interconnects, particularly in embodiments employing direct bonding, thus increasing overall speed of the system and reliability of the package.

FIGS. 2A-2K are schematic side cross-sectional views of various stages of a method for forming a bonded structure 1 in which electrical interconnects 10 are formed after thinning, according to another embodiment. Unless otherwise noted, reference numerals shown in FIGS. 2A-2K represent components which are the same as or similar to like-numbered components of FIGS. 1A-1F. Moreover, any of the processes, materials, functionalities, and structures disclosed in connection with FIGS. 1A-1F may be used in the embodiment of FIGS. 2A-2K. Unlike the embodiment of FIGS. 1A-1F, the protective material may be formed before thinning and the interconnects 10 may be formed after thinning.

As with FIGS. 1A-1F, in FIG. 2A, first dies 3a, 3b (which may comprise KGDs) may be mounted (e.g., directly bonded) to the substrate 2. The first dies 3a, 3b may have an initial thickness $t_i$. In FIG. 2B, however, the first layer 12 can be applied over the backside 18 of the dies 3a, 3b and in the gap 7 between the dies 3a, 3b before the dies 3a, 3b are thinned. As with FIGS. 1A-1F, the first portion 13 of the first layer 12 can be disposed along the sides of the dies 3a, 3b, and along the substrate 2 in the gap 7 between the dies 3a, 3b. The first layer 12 can comprise any of the materials and properties described above in connection with FIGS. 1A-1F. The first layer 12 may have a thickness chosen and processed in such a manner not to exceed the desired final die thickness $t_f$ and to reduce or eliminate the warpage of the entire laminate structure 1 (see FIG. 2D).

Turning to FIG. 2C, the second layer 15 can be deposited or otherwise provided over the first layer 12. As with the embodiment of FIG. 1D, the third portion 16 of the second layer 15 can be disposed in the gap 7 between the dies 3a, 3b, including, e.g., between side surfaces of the first portion 13 of the first layer 12. The fourth portion 17 of the second layer 15 can be disposed over the second portion 14 of the first layer 12. As explained above, the second layer 15 can act as a filler material to facilitate planarization of the back side of the bonded structure 1. The second layer 15 may be less expensive and less hard than the first layer 12 in some arrangements.

Turning to FIG. 2D, the back side of the partially-formed structure 1 can be removed to remove at least portions (e.g., all) of the second layer 15, portions of the first layer 12, and portions of the dies 3a, 3b to expose the exposed back surface 19 of the dies 3a, 3b. For example, the partially-formed structure 1 can be grinded and/or lapped to thin the dies 3a, 3b to the desired final thickness $t_f$, which may be in the same range as that explained above in connection with FIGS. 1A-1F. In FIG. 2D, the at least part of the first portion 13 of the first layer 12 is disposed laterally between the dies 3a, 3b, including, for example, along the sides of the dies 3a, 3b. The first layer 12 of protective material thus protects the edges of the die from chipping during the die thinning process.

In FIG. 2E, a wiring dielectric layer 22 (which may comprise silicon oxide or other suitable insulator or semiconductor material) can be deposited or otherwise formed over the back side of the partially-formed structure 1. For example, the dielectric layer 22 can be provided over the first portions 13 of the first layer 12 and over the exposed back surface 19 of the dies 3a, 3b and polished to a low roughness (e.g., less than about 0.5 nm RMS) if desired. Turning to FIG. 2F, a mask 24 can be deposited over the dielectric layer 22 and can be patterned to define locations for the interconnects. For example, in some embodiments, the mask 24 can comprise photoresist which can be masked and exposed to a light source. For a positive resist example, the unmasked, exposed portions can be removed using a suitable developing agent to define patterned spaces 25 in the mask 24. In FIG. 2G, one or more vias or traces 26 can be formed using a suitable material removal process, such as etching. For example, an etchant may be supplied to the partially-formed bonded structure to etch the vias 26 through the thickness of the dies 3a, 3b at locations that are uncovered by the mask 24. Any suitable etching process (e.g., wet etch, dry etch, RIE, etc.) may be used to define the vias 26. The bonding layer 5 may act as an etch stop in some embodiments. In other embodiments, the routing layer 34 or the upper surface of the substrate 2 may act as an etch stop. In some embodiments, a single or dual damascene etching process may be used to define vias and trenches in the dielectric layer 22, for example for forming a redistribution layer (RDL). In some embodiments, the trench of a damascene structure may extend into the thinned dies 3a and/or 3b.

Turning to FIG. 2H, the mask 24 can be removed and surfaces cleaned to remove unwanted contaminates from the previous etching method. The liner 9 and conductive interconnects 10 can be supplied to fill the vias 26. For example, in some embodiments, a barrier layer is deposited over the semiconductor material of the dies 3a, 3b, and a seed layer is formed. The vias 26 (and any lateral trenches) can be filled with a metal to define the interconnects 10. In some arrangements, the structure 1 can be annealed to stabilize or partially stabilize the metallic interconnects 10, and the interconnects 10 (and backside of the partially-formed structure 1) can be polished, for example, using a CMP process. FIG. 2I illustrates that, in some embodiments, one or more test pads 28 can be incorporated within or on the dielectric layer 22. The test pads 28 may be used to facilitate electrical testing of continuity between the dies 3a, 3b and the substrate 2 during assembly.

Turning to FIG. 2J, one or more second dies 4a, 4b can be stacked on and directly bonded with the first dies 3a, 3b. In FIG. 2J, the test pads 28 may also be used to facilitate electrical testing of continuity between dies 3a and 4a, between dies 3b and 4b, between dies 3a and 4b, and/or between dies 3b and 4a during assembly. FIG. 2K illustrates an alternative similar to the bonded structure 1 of FIG. 2J, except that the test pads 28 are connected to the substrate 2 with vias 29. As explained above, interconnect or conductive features on the surface of the fourth dies 4a, 4b can be directly bonded with corresponding interconnect or conductive features of the back surface of the third dies 3a, 3b. Nonconductive field regions of the fourth dies 4a, 4b can also be directly bonded with corresponding nonconductive field regions of the third dies 3a, 3b. In the embodiment of FIGS. 2J-2K, the second dies 4a, 4b are illustrated as including interconnects 10 before thinning. In such an arrangement, the embodiment of FIGS. 1A-1F may be employed to thin the dies 4a, 4b and prepare the dies 4a, 4b for bonding with a third set of dies (not shown). In other embodiments, however, it should be appreciated that the second dies 4a, 4b may not include interconnects prior to thinning, and the embodiment of FIGS. 2A-2I may be used to thin the dies 4a, 4b and provide the interconnects 10 after thinning.

FIGS. 3A-3O are schematic side cross-sectional views of various stages of a method for forming a bonded structure 1 in which the protective material includes a first layer 12 comprising a thin protective liner, according to another embodiment. Unless otherwise noted, reference numerals shown in FIGS. 3A-2O represent components which are the same as or similar to like-numbered components of FIGS. 1A-2K. Moreover, any of the processes, materials, functionalities, and structures disclosed in connection with FIGS. 1A-2K may be used in the embodiment of FIGS. 3A-3O. The embodiment of FIGS. 3A-3O is generally similar to that disclosed above in connection with FIGS. 1A-1F, except the first layer 12 comprises a thin liner that is thinner than the target thickness for the thinned die, and the protective material that remains adjacent the thinned die(s) after thinning further comprises a filler material.

As with FIGS. 1A-1F, in FIG. 3A, first dies 3a, 3b are mounted to (e.g., directly bonded to) a carrier such as the substrate 2. In FIG. 3B, the backside 18 of the dies 3a, 3b facing away from the substrate 2 is thinned, for example, by etching back the die bulk material (e.g., silicon) to leave an exposed back surface 19 of the thinned dies 3a, 3b. The interconnects 10 and liners 9 can be exposed through the back surfaces 19 of the dies 3a, 3b. Moreover, as with FIGS. 1A-1F, in FIG. 3C, the first layer 12 can be applied (e.g., deposited, laminated, etc.) over the back surfaces 19 of the dies 3a, 3b and in the gap 7 between the dies 7. For example, the first portion 13 of the first layer 12 can be disposed along side surfaces of the dies 3a, 3b and over the substrate 2. The second portion 14 of the first layer 12 can be disposed over the back surfaces 19 of the dies 3a, 3b, and around the interconnects 10.

The first layer 12 shown in FIG. 3C can be the same as that described above in connection with FIGS. 1A-2K, except the layer 12 in FIG. 3C may comprise a thin protective liner layer thinner than the thinned dies 3a, 3b. For example, the layer 12 may have a thickness in a range of 300 nanometers to 15 microns, or more particularly, in a range of 1 micron to 10 microns, or in a range of 1 micron to 5 microns. In some embodiments, the layer 12 can have a thickness in a range of 2 microns to 10 microns, e.g., in a range of 2 microns to 5 microns. As with the embodiments of FIGS. 1A-2K, the layer 12 can protect the dies 3a, 3b (e.g., the die edges) during subsequent processing steps. The layer 12 can act to lock in and seal the dies 3a, 3b during processing. Advantageously, the protective first layer 12 of FIG. 3C can comprise silicon oxide, which might otherwise be too expensive, time consuming and/or stressful for use in larger thicknesses of silicon oxide that is as thick as the thinned die(s). In other embodiments, the first layer 12 can comprise any of the materials having the characteristics explained above in connection with FIGS. 1A-1F.

In FIG. 3D, the second layer 15 of the protective material can be deposited over the first layer 12. The second layer 15 can be thicker than the first layer 12. The second layer 15 can comprise a filler material (e.g., a polymer) filled with filler particles. For example, the second layer can comprise a composite material having a polymeric base layer filled with particles having a diameter in a range of 2 nm to 30 nm. In some embodiments, the filler particles can comprise silicon oxide or silicon nitride particles. The filler particles can enhance the hardness of the second layer 15 and can improve thermal matching with the first layer 12 and the dies 3a, 3b. The composite second layer 15 can have a high glass transition temperature (GTT) as explained above, e.g., greater than 150° C., greater than 200° C., greater than 250° C., or greater than 300° C.

Thus, it can be advantageous to select a second layer 15 which has a high GTT, e.g., a GTT greater than 100° C., greater than 150° C., greater than 200° C., greater than 250° C., or greater than 300° C. In some embodiment, for a crosslinked material, the GTT of the first layer can be less than 100° C. provided that the Poisson ratio is greater than 0.4 and preferably close to 0.5, e.g., a Poisson ratio in a range of 0.25 to 0.8, and with a thermal decomposition temperature greater than 250° C., or greater than 300° C.

As explained above, it can be important to select a second layer 15 which is stiff and/or hard with a high Young's modulus, which has a coefficient of thermal expansion similar to that of the substrate (e.g., similar to that of silicon or glass in the case of silicon or glass substrates), and which has a glass transition temperature, or GTT, which exceeds the highest processing temperatures used to form the bonded structure 1. For example, in some embodiments, the second layer 15 can comprise silicon, inorganic oxide, inorganic nitride, inorganic carbide, or carbonate, for example, silicon oxide, silicon nitride, silicon carbide, diamond like carbon (DLC) or other types of semiconductor materials and non-semiconductor materials. In other embodiments, a polymer may be used. For example, the second layer 15 may comprise a polyimide or polyimide-amide. In some embodiments, the second layer 125 can comprise Torlon®. In some embodiments, as explained herein, the first layer 12 can comprise a base material (such as a polymer) that is filled with filler particles (such as oxide or nitride particles, or carbonates, or mica, treated or untreated kaolin, talc treated or clay materials for example untreated bentonite). The filler particles may assist in reducing the thermal expansion coefficient of layer 15 and rendering the CTE of layer 15 closer to that of the substrate 2 or first layer 12. The filler may increase the hardness or stiffness of the layer 12. The filler content in layer 12 can vary between 10% to 90%, e.g., between 20% and 85%, or more particularly, between 30% and 80%. The filler particles may be sized in a range of 2 nm to less than 20 microns, e.g., between 50 nm and 5 microns. In one embodiment, the size of a filler particulate is less than 30% of the gap 7 disposed between dies 3a and 3b. In other embodiments the size of a filler particulate is less than 10% of the gap 7 between dies 3a and 3b, e.g., less than 2% of the gap 7 between dies 3a and 3b. In some embodiments, the size of a filler particulate in the gap 7 is less than 30% of the final die thickness $t_f$ and preferably less than 5% of the final thickness $t_f$ of the die. In some embodiments, the width or length of a particulate adjacent to the vertical side wall dies 3a or 3b can be less than 15% of the final thickness $t_f$ of the dies 3a or 3b. Because the dies 3a, 3b have already been thinned in the illustrated embodiment, these materials may be used with the first layer 12 without introducing excessive stresses or excessive expense.

The second layer 15 may comprise a filler layer which fills spaces or gaps in the first layer 12 to facilitate planarization. The second filler layer 15 may comprise the types of particulates recited above for the first layer 12. The second layer 15 can have a thickness in a range of 4 to 120 microns, or more particularly, in a range of 8 microns to 45 microns. As shown, the second layer 15 comprises a third portion 16 adjacent the dies 3a, 3b, such as in the gaps 7 between dies where multiple dies are laterally arrayed as shown, and a fourth portion 17 over the dies 3a, 3b.

As with the embodiment of FIGS. 1A-1F, the backside of the partially-formed structure 1 can be partially removed, e.g., part of the second layer 15 and part of the first layer 12 can be removed using, for example, a planarization or polishing (e.g., CMP) process. As shown in FIG. 3E, the fourth portion 17 of the second layer 15 can be removed, and portions of the interconnects 10 can be removed to expose the conductive regions of the interconnects 10 (e.g., the distal liner portion 9a can be removed). In FIG. 3E, the first portions 13 of the first layer 12 can remain disposed adjacent the die sidewalls, in the gap 7 between the dies 3a, 3b in the illustrated embodiment, and the third portions 16 of the second layer 15 can be disposed adjacent the die sidewalls, in the gap 7 between the sides of the first portions 13 in the illustrated embodiment. At least part of the second portion 14 of the first layer 12 can remain disposed over the dies 3a, 3b and around the exposed interconnects 10 and liners 9. As explained above, the second portion 14 of the first layer 12 can prevent the interconnects 10 from smearing across the dies 3a, 3b during planarization. The protective material, including the the first layer 12 and the remaining portions of the second layer 15 (e.g., the third portion 16), can beneficially protect the corners of the dies 3a, 3b during planarization. In some embodiments (not shown) only portions of the fourth portion 17 of the second layer 15 is removed along with portions of the interconnects 10 to expose the conductive regions of the interconnects 10 (e.g., the distal liner portion 9a can be removed). In this configuration, the second layer 15 laterally surrounds the conductive interconnect 10 after the removal or planarization process.

In FIG. 3F, the structure 1 can be prepared for direct bonding with the second dies 4a, 4b, as explained above. A conductive redistribution layer 36 can be applied over the first dies 3a, 3b, for example, over the second portion 14 of the first layer 12 and over the third portion 16 of the second layer 15. The second dies 4a, 4b can be direct bonded with the first dies 3a, 3b. Moreover, as shown in FIGS. 3G-3K, the second dies 4a, 4b can be thinned and prepared for subsequent direct bonding as explained in connection with FIGS. 3A-3E. In FIG. 3L, third dies 30 can be stacked on and directly bonded with the second dies 4a, 4b. Any suitable number of integrated device dies may be stacked on and bonded together to form the final bonded structure 1. In some other applications a redistribution layer may not be needed, as in FIG. 3F, the structure 1 can be prepared for direct bonding with the second dies 4a, 4b. The interconnection features of second dies 4a, 4b can be direct bonded with the first dies 3a, 3b.

FIG. 3M illustrates an at least partially-formed bonded structure 1 similar to that shown in FIG. 3J, except there may be voids 37 (e.g., air pockets) within the second layer 15. The voids 37 may not negatively affect the mechanical performance of the bonded structure 1 or the assembly thereof, and may advantageously lower the effective stress in the laminate, thus reducing the bow of the structure 1. The presence of voids 37 may advantageously lower the k value of the dielectric between conductive elements of the assembly and reduce parasitic capacitance. Similarly, in FIG. 3N, the second layer 15 may comprise a porous material with a plurality of pores 38. The pores 38 may be ordered or random. In some arrangements, the pores 38 may be oriented in a networked structure. In FIG. 3O, in embodiments similar to FIGS. 1A-2K where the protective material comprises only the first layer 12, the first layer 12 may comprise a homogeneous material which fills the entire spaces or gaps 7 between the dies 3a, 3b. There may or may not be voids 37 in the first layer 12.

Advantageously, the embodiment of FIGS. 3A-3O can enable the use of a protective material including a first layer 12 (e.g., silicon oxide) to protect the dies 3a, 3b during processing, and the third portion 16 of the second layer 16 between adjacent dies 3a, 3b. The second filler layer 15 may comprise any suitable material (and can include voids or pores) to facilitate planarization. The use of the first layer 12 as a liner can enable the use of thinner silicon oxide or other similar materials, as compared to the thickness of the thinned dies 3a, 3b, which may otherwise be too expensive and/or too stressful to apply in thicker layers. Without being limited thereto, the embodiments of FIGS. 3A-3O are particularly useful where the target thickness for the thinned dies 3a, 3b is between about 2 microns and 240 microns, e.g., between 3 microns and 50 microns.

FIGS. 4A-4K are schematic side cross-sectional views of various stages of a method for forming a bonded structure 1 in which the dielectric layers between the dies 3a, 3b are symmetric (or approximately symmetric) and include an additional protective layer, according to yet another embodiment. Unless otherwise noted, reference numerals shown in FIGS. 4A-4K represent components which are the same as or similar to like-numbered components of FIGS. 1A-3O. Moreover, any of the processes, materials, functionalities, and structures disclosed in connection with FIGS. 1A-3O may be used in the embodiment of FIGS. 4A-4K. The embodiment of FIGS. 4A-4K is generally similar to that disclosed above in connection with FIGS. 3A-3K, except that the protective material includes an additional protective layer 40 applied over the second layer 15.

Figure 4B:
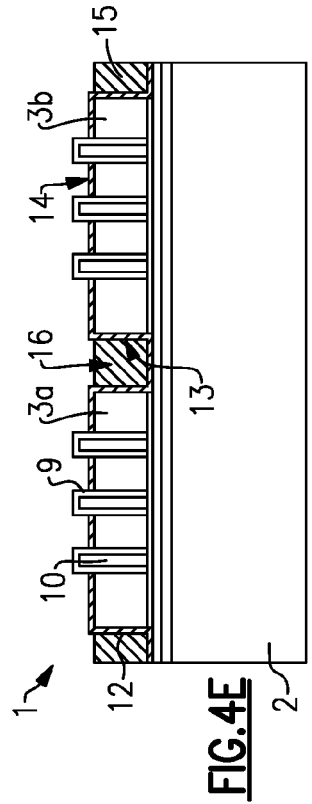
Figure 4C:
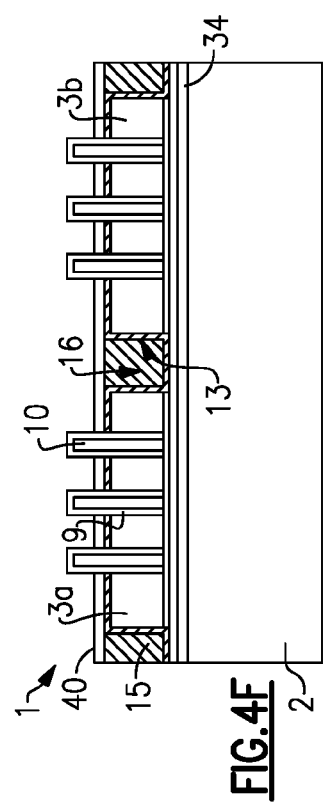
Figure 4D:
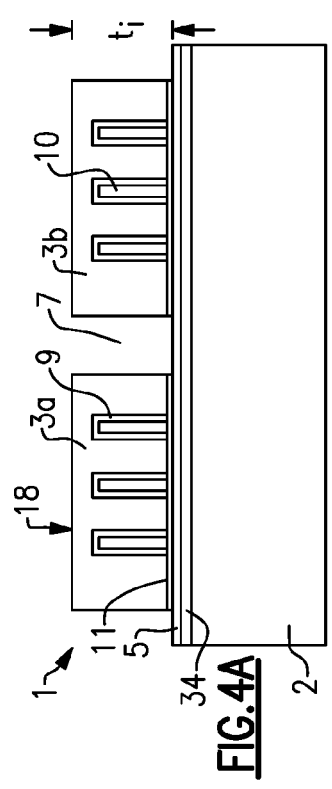
Figure 4E:
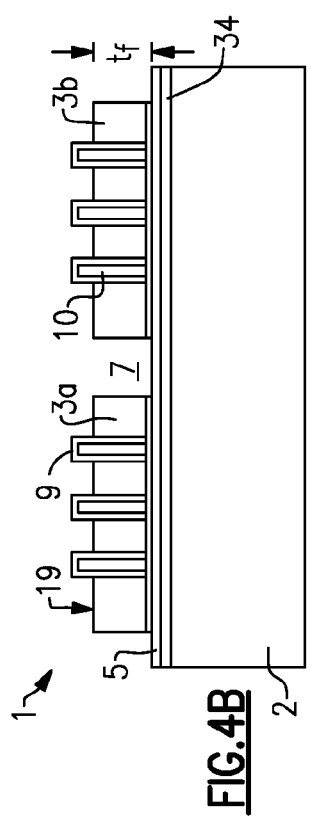

For example, in FIG. 4A, one or more first dies 3a, 3b can be mounted and directly bonded to a carrier comprising the substrate 2. In FIG. 4B, the backside 18 of the dies 3a, 3b can be partially removed, for example, by etching, to expose the interconnects 10 and liners 9. In FIG. 4C, the first layer 12 of the protective material (which comprises a thin liner) can be applied over the exposed back surfaces 19 of the thinned dies 3a, 3b and over the substrate 2. In FIG. 4D, the second filler layer 15 can be applied over the first layer 12. In FIG. 4E, the backside of the partially-formed structure 1 can be partially removed, e.g., the fourth portion 17 of the second layer 15 can be removed from over the first layer 12 on the dies 3a, 3b, and the third portion 16 of the second layer 16 can also be partially recessed within the gaps 7 adjacent or between the dies 3a, 3b. In some embodiments, the second protective layer 15 may comprise a compliant polymeric layer with a Poission ratio between 0.4 and 0.5. The second layer 15 can removed in various ways, for example, by etching. In other embodiments, the second layer 15 can be removed by directional or isotropic etching. Part of the first layer 12 may also be removed in some embodiments.

Figure 4F:
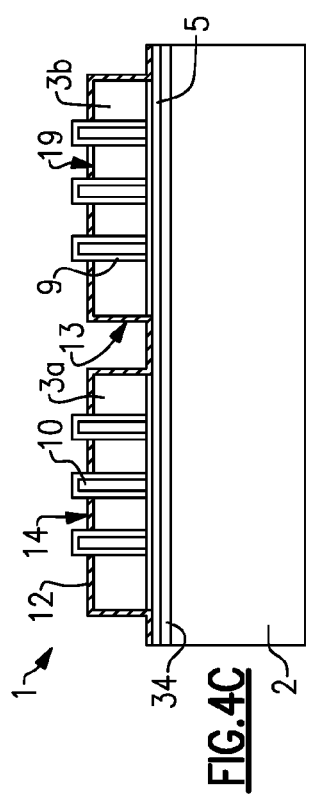

Unlike the embodiment of FIGS. 3A-3O, however, the protective material can further include an additional or third protective layer 40 applied over the backside of the partially-formed bonded structure 1. For example, as shown in FIG. 4F, the additional protective layer 40 can be applied (e.g., deposited) over the third portions 16 of the second layer, over the second portions 14 of the first layer 12, and around the exposed interconnects 10 and liners 9. The additional protective layer 40 can be similar to or the same as the first protective layer 12. For example, in the illustrated embodiment, the first layer 12 and the additional protective layer 40 can comprise silicon, or a base inorganic or organic dielectric material. However, any of the materials described above for the first layer 12 can also be used for the additional protective layer 40.

Beneficially, the additional protective layer 40 can provide a symmetric protective material adjacent the die(s), which can serve as an inter-die dielectric layer. In some arrangements without the additional layer 40, when the backside of the structure 1 is polished (e.g., by CMP), there may be dishing in the region between the dies 3a, 3b, e.g., dishing in the third portions 16 of the second layer 15. For example, the second layer 15 may comprise a material which is not as hard as the first or third layers. Polishing the third portions 16 of the second layer 15 may cause dishing which can negatively affect the stacking and bonding of the dies and/or can create voids or misalignments. Accordingly, providing the additional protective layer 40 can fill in the recessed regions of the third portion 16 of the second layer 15 (which may be hard) and can protect the second layer 15 from dishing and further protect the dies 3a, 3b. Furthermore, the symmetry of the protective material provides a balanced coefficient of thermal expansion (CTE) for the cavity between dies 3a, 3b on the substrate 2.

Thus, in FIG. 4F, the protective material can comprise the first layer 12 (which may be formed over sidewalls and the back surface 19 of the dies 3a, 3b), the third portion 16 of the second layer 15 between the dies 3a, 3b, and the additional protective layer 40 provided over the backsides of the third portion 16 and the dies 3a, 3b. In the illustrated embodiment, the additional protective layer 40 can be applied over both the second portion 14 of the first layer 12 over the dies 3a, 3b, and over the third portion 16 of the second layer 15. In other arrangements, however, the additional protective layer 40 may be provided over only the third portion 16 of the second layer 15 and may not be deposited over the first layer 12 or the dies 3a, 3b.

In FIG. 4G, the backside of the partially-formed structure 1 can be planarized, e.g., polished, for example, using CMP. The planarization can be configured to stop on the additional protective layer 40 and remove the exposed portions of the interconnects 10 and liners 9 such that the interconnects 10 and liners 9 are substantially flush with the additional protective layer 40. In FIG. 4H, the second dies 4a, 4b can be stacked on and directly bonded to the first dies 3a, 3b, as explained above. FIGS. 4I-4K illustrate that the second dies 4a, 4b can also be thinned and prepared for direct bonding in a manner similar to that described in connection with FIGS. 4A-4G. Furthermore, the skilled artisan will readily appreciate in view of the disclosure herein that additional (third, fourth, etc.) dies can be similarly stacked, and that the symmetric protective material of FIGS. 4A-4K can also include voids in the second material 15, similar to the keyholes and pores illustrated in FIGS. 3M and 3N.

FIGS. 5A-5I are schematic side cross-sectional views of various stages of a method for forming a bonded structure 1 in which more than two dielectric layers are provided over the dies prior to stacking, according to another embodiment. Unless otherwise noted, reference numerals shown in FIGS. 5A-5I represent components which are the same as or similar to like-numbered components of FIGS. 1A-4K. Moreover, any of the processes, materials, functionalities, and structures disclosed in connection with FIGS. 1A-4K may be used in the embodiment of FIGS. 5A-5I. The embodiment of FIGS. 5A-5I is generally similar to that disclosed above in connection with FIGS. 3A-4K, except three layers may be applied over the dies 3a, 3b prior to thinning and stacking.

As shown in FIG. 5A, first dies 3a, 3b can be mounted to and directly bonded with a carrier comprising the substrate 2. The initial thickness $t_i$ of the dies 3a, 3b can be thicker than in some arrangements. For example, the initial thickness $t_i$ can be in a range of 30 microns to 1500 microns, in a range of 200 microns to 1000 microns, or in a range of 500 microns to 1000 microns. As explained above, the methods disclosed herein can be utilized with dies that are any suitable thickness. In FIG. 5B, the protective material includes the first protective layer 12, which can be deposited over the dies 3a, 3b before the dies 3a, 3b are thinned. As above, the first layer 12 can be thinner than the target thickness for the thinned dies and can protect the dies 3a, 3b (e.g., the die edges) during subsequent processing. In FIG. 5C, the protective material also includes the second filler layer 15, which can be provided over the first layer 12. As shown in FIG. 5C, the second filler layer 15 may not completely fill or planarize the partially-formed structure 1. Rather, as shown in FIG. 5C, there may be spaces 47 between portions of the second layer 15. However, the thickness of the second filler layer 15 may be greater than the target thickness for the thinned dies.

To planarize the partially-formed structure, in FIG. 5D, a third filler layer 45 can be provided over the second layer 15 to fill spaces 47 that remain in the second layer 15. A fifth portion 48 of the third layer 45 can be disposed in the spaces 47. A sixth portion 49 of the third layer 45 can be disposed over the second layer 15, e.g., over the fourth portion 17 of the second layer 15. The third layer 45 can be any suitable material. For example, the third layer 45 can comprise any suitable material described above for the first layer 12 or the second layer 15. In FIG. 5E, the backside of the partially-formed structure 1 can be removed at least partially, for example, by grinding and/or polishing (e.g., by CMP). The grinding or polishing can remove most or all the third layer 45, and portions of the second layer 15 and first layer 12. The grinding or polishing may be terminated at or proximate to the distal portion 9a of the liner 9.

Turning to FIG. 5F, the backsides 18 of the dies 3a, 3b can be removed, e.g., by etching back so as to expose a back surface 19 of the thinned dies 3a, 3b. The removal of the backsides 18 can expose the interconnects 10 and liners 9. In FIG. 5G, an additional protective layer 40 (e.g., a dielectric layer such as silicon oxide) can be provided over the partially-formed structure. For example, the additional protective layer 40 can be disposed over the third portions 16 of the second layer, over edges of the first portions 13 of the first layer 12, over the back surfaces 19 of the dies 3a, 3b, and around the liners 9 and interconnects 10. In FIG. 5H, portions of the additional protective layer 40 and/or portions of the interconnects 10 can be removed to expose the conductive material of the interconnects 10. For example, the partially-formed structure 1 can be polished (e.g., by CMP) to remove an upper portion of the additional protective 40 and the distal portions 9a of the liners 9. Turning to FIG. 5I, the first dies 3a, 3b can be prepared for direct bonding as explained above, and the second dies 4a, 4b can be stacked on and direct bonded to the first dies 3a, 3b. The steps of FIGS. 5A-5H can be repeated to stack and bond any suitable number of integrated device dies to form the final bonded structure 1. Although the sequence differs, depending upon the materials and thicknesses chosen for the first layer 12 (liner), second layer 15 (filler) and additional protective layer 40 (cap), the resulting structure can be similar to the symmetrical protective materials in the embodiment of FIGS. 4A-4K.

FIGS. 6A-6E are schematic side cross-sectional views of various stages of a method for forming a bonded structure 1 with multiple dies 3a-3c which have different initial thicknesses $t_i$. Unless otherwise noted, reference numerals shown in FIGS. 6A-6E represent components which are the same as or similar to like-numbered components of FIGS. 1A-5I. Moreover, any of the processes, materials, functionalities, and structures disclosed in connection with FIGS. 1A-5I may be used in the embodiment of FIGS. 6A-6E.

In FIG. 6A, multiple first dies 3a-3c can be mounted to and directly bonded to a carrier comprising the substrate 2. Unlike the illustrated embodiments above, however, the adjacent dies 3a-3c may have different initial thicknesses $t_i^a$, $t_i^b$, and $t_i^c$. The initial thicknesses $t_i^a$, $t_i^b$, and $t_i^c$ may be any suitable thickness. For example, the initial thicknesses $t_i^a$, $t_i^b$, and $t_i^c$ may be in a range of 40 microns to 2000 microns, in a range of 100 microns to 1500 microns, in a range of 200 microns to 1000 microns, in a range of 500 microns to 1000 microns, etc.

Turning to FIG. 6B, a protective material including the first layer 12 can be provided over the dies 3a-3c and over the substrate 2. As explained above, the first layer 12 can protect the dies during processing. In FIG. 6C, the second layer 15 can be provided over the first layer to assist in planarizing the partially-formed structure 1. As with the embodiment of FIGS. 5A-5I, the second layer 15 may not completely planarize and fill gaps in the first layer 12. Accordingly, the third layer 45 can be provided over the second layer 15 to fill gaps in the second layer 15 and complete the planarization of the structure 1. Although three dielectric layers 12, 15, 45 are shown in FIG. 6D, it should be appreciated that additional dielectric layers may be provided to planarize the partially-formed structure. Conversely, the first and second layers could be replaced by a single conformal or lining protective layer.

In FIG. 6E, the backside of the partially-formed structure 1 can be partially removed, e.g., parts of the third layer 45, the second layer 15, and the first layer 12 can be removed by, for example, grinding, polishing, and/or etching. In the illustrated embodiment, the interconnects and liners can be provided after thinning, as shown in FIGS. 2A-2K. In other embodiments, however, the interconnects and liners can be formed prior to thinning. In the embodiment of FIG. 6E, the dies 3a-3c may have about the same final thickness $t_f$, even though the initial thicknesses $t_i^a$, $t_i^b$, and $t_i^c$ may differ significantly. Advantageously, therefore, the embodiments disclosed herein can enable the use of dies have different thicknesses, and incorporate such dies into a stacked and bonded structure 1. In some embodiments, after stacking multiple dies on the substrate or carrier 2 to form the bonded structure, the substrate 2 can be thinned from the backside (not shown) and processed to form electrically coupling structures over the thru substrate and conductive interconnects 10 in the substrate 2. The substrate can be singulated into multiple packages, with each package comprising one or more stacked dies 3a or stacked dies 3a, 3b. The singulated stacked dies or packages may be mounted on another substrate, board, or another package.

Figure 7A:
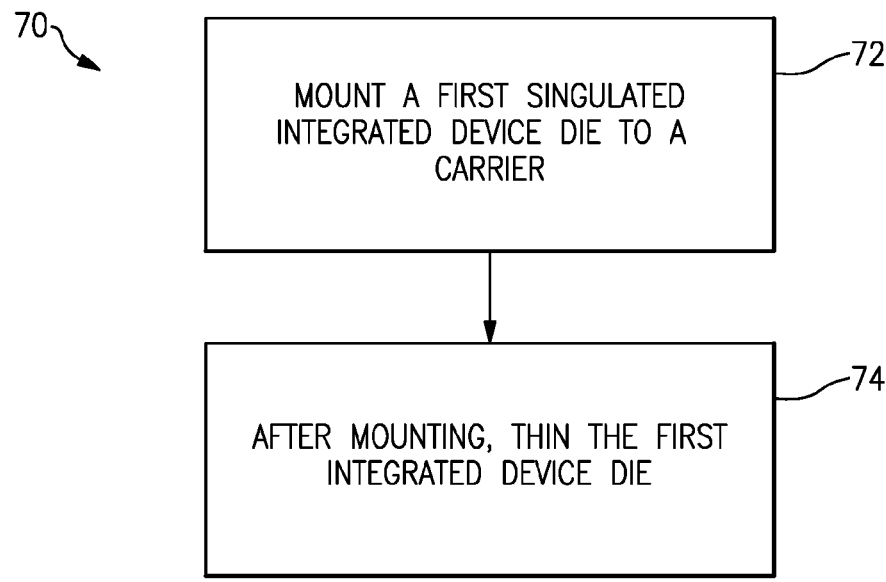
FIG. 7A is a flowchart illustrating a method for forming a bonded structure, according to one embodiment.

FIG. 7A is a flowchart illustrating a method 70 for forming a bonded structure, according to one embodiment. The method 70 can be used in conjunction with the embodiments of FIGS. 1A-6E. In a block 72, a first singulated integrated device die can be mounted to a carrier. As explained herein, the first die can comprise any suitable type of integrated device die. In some embodiments, the die may comprise a KGD, e.g., the die may be tested before mounting. As explained herein, the die may be direct bonded to the carrier in some embodiments, e.g., the die and the carrier can be suitably prepared for bonding. Nonconductive and conductive regions of the die and carrier can be directly bonded to one another without intervening adhesives and without application of external pressure.

Turning to a block 74, after mounting, the first integrated device die can be thinned. For example, in some arrangements, the backside of the first die (which may be opposite the active or front side) can be etched, grinded, or polished to remove portions of the first die. Thinning the first die can enable the use of multiple device dies in a low-profile packaging arrangements. Moreover, as explained herein, in some embodiments, interconnects (e.g., TSVs) may be formed in the first die before thinning or after thinning. In the embodiments of FIGS. 1A-6E, a protective material (which can include various portions of one or more of the first layer 12, the second layer 15, the additional protective layer 40, and the third layer 45) can be applied over the first die and over portions of the carrier that are disposed between the die. The protective material can be provided before thinning or after thinning. In various embodiments, additional device dies can be stacked on and connected to (e.g., directly bonded with) the first die.

Figure 7B:
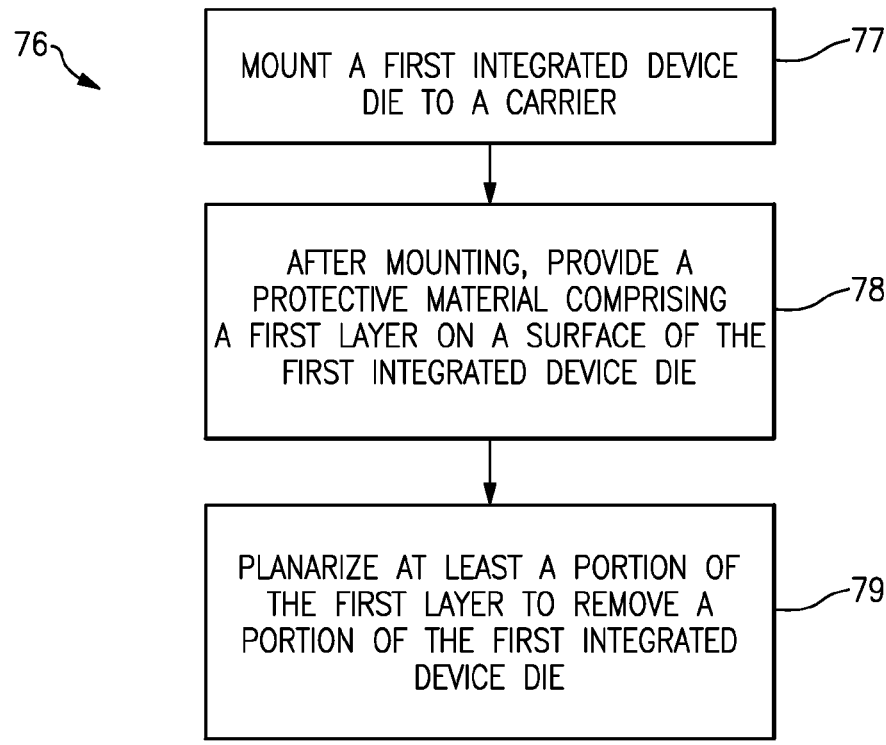
FIG. 7B is a flowchart illustrating a method for forming a bonded structure, according to another embodiment.

FIG. 7B is a flowchart illustrating a method 76 for forming a bonded structure, according to another embodiment. The method 76 can be used in conjunction with the embodiments of FIGS. 1A-6E. In a block 77, a first integrated device die (which can be singulated) can be mounted to a carrier. As explained herein, the first die can comprise any suitable type of integrated device die. In some embodiments, the die may comprise a KGD, e.g., the die may be tested before mounting. As explained herein, the die may be direct bonded to the carrier in some embodiments, e.g., the die and the carrier can be suitably prepared for bonding. Nonconductive and conductive regions of the die and carrier can be directly bonded to one another without intervening adhesives and without application of external pressure.

Turning to a block 78, after mounting, a protective material comprising a first layer can be provided on a surface of the first integrated device die. Beneficially, the first layer can protect the edges of the first die from chipping during planarization or other processing steps. The first layer can comprise a relatively hard material with a CTE which is close to that of the first die and which has a relatively high GTT. The first layer can be provided over the exposed back surface of the first die and over portions of the carrier between adjacent dies. As explained herein, in some embodiments, the protective material can include additional layers (such as portions of the second layer 15, the third layer 45, and the additional protective layer 40) disposed over the first die and/or in the space between adjacent dies.

In a block 79, at least a portion of the first layer can be planarized to remove a portion of the first integrated device die. For example, in some embodiments, a chemical mechanical polishing (CMP) technique can be used to remove some of the first layer, which can expose interconnects in some embodiments. In embodiments in which the protective material comprises multiple layers, the other layers may be partially or entirely removed during planarization. Advantageously, the protective material can protect the dies during the planarization process. As explained herein, additional device dies can be stacked on and connected to (e.g., directly bonded with) the first integrated device die.

Figure 8:
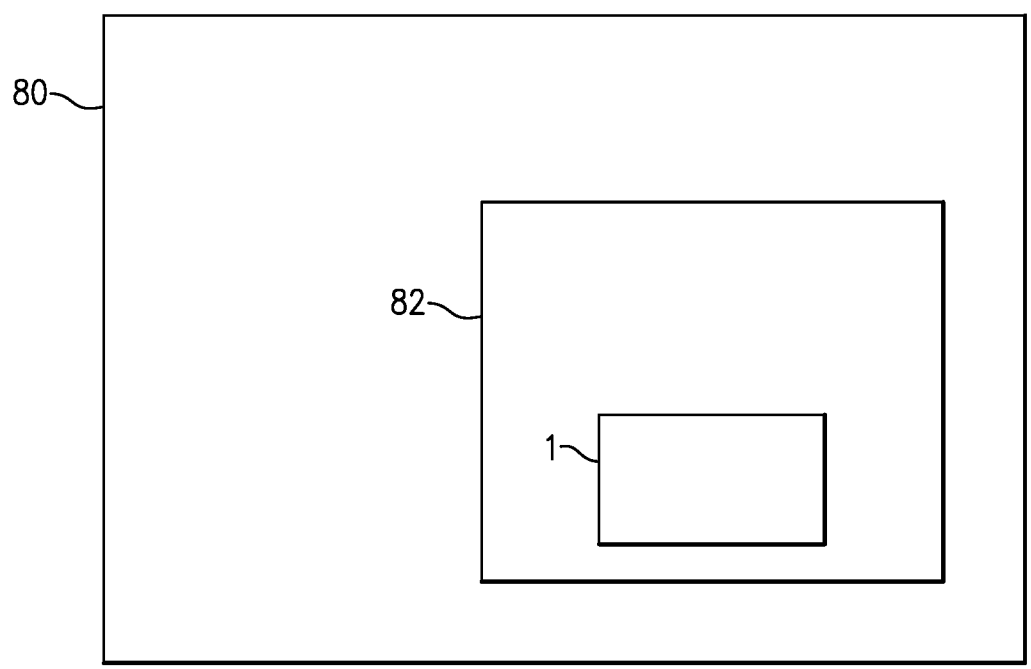
FIG. 8 is a schematic diagram of a system incorporating one or more bonded structures, according to various embodiments.

FIG. 8 is a schematic diagram of a system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The bonded structures 1 shown in FIG. 8 can comprise any of the bonded structures 1 shown and described above in connection with FIGS. 1A-7B. The bonded structure 1 can include one or more integrated device dies which perform various functions for the system 80.

Thus, the embodiments disclosed herein can advantageously enable the thinning of dies after singulation, at the packaging level. The use of the protective material including the first protective layer 12 can beneficially protect the dies, and in particular, the die edges, during polishing. The first protective layer 12 can lock in and seal the dies during processing. Moreover, the protective material can further include the second filler material between gaps of the first layer 12 which can beneficially facilitate planarization of the structure. In some embodiments, a third filler material, and indeed any suitable number of filler materials, can be used to facilitate planarization of the structures. In some embodiments, the second filler material can include embedded filler particles to improve the mechanical and thermal properties of the filler material. In some embodiments, an additional protective layer 40 may be provided over the second layer 15 (or other layers) to provide a symmetric dielectric structure which resists dishing and improves overall yield. Thinning after mounting singulated dies on a substrate can also facilitate subsequent stacking and bonding of dies.

Advantageously, the methods disclosed herein can use dies with any suitable initial thickness, and adjacent dies may have different thicknesses. In addition, the etch times of the dies (e.g., silicon dies) can be reduced since the amount of etching may be less than in other processes. Moreover, the time for polishing, plating, and providing the conductive interconnects may also be reduced since the dies may be thinned prior to forming the interconnects in some embodiments.

In one embodiment, a method for forming a bonded structure is disclosed. The method can comprise mounting a first singulated integrated device die to a carrier. The method can comprise thinning the first integrated device die after mounting. The method can comprise providing a protective material comprising a first layer on an exposed surface of the first integrated device die.

In another embodiment, a bonded structure is disclosed. The bonded structure can include a carrier and a first integrated device die having a lower surface mounted to an upper surface of the carrier. The first integrated device die can comprise an upper surface opposite the lower surface and a side surface between the upper and lower surfaces of the first integrated device die. The bonded structure can comprise a protective material comprising a first layer having a first portion disposed on the side surface of the first integrated device die, the first layer being harder than side surface of the first integrated device die.

In another embodiment, a method for forming a bonded structure is disclosed. The method can comprise mounting a first integrated device die to a carrier. The method can comprise, after mounting, providing a protective material comprising a first layer on a surface of the first integrated device die. The method can comprise planarizing at least a portion of the first layer to remove a portion of the first integrated device die.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A method for forming a bonded structure, the method comprising:
    directly bonding a first singulated integrated device die to a carrier without an intervening adhesive such that respective bonding surfaces of the first singulated integrated device die and the carrier are in direct contact;
    after directly bonding, thinning the first integrated device die; and
    providing a protective material comprising a first layer on an exposed surface of the first integrated device die.

2. The method of claim 1, further comprising removing at least a portion of the first layer.

3. The method of claim 2, wherein the first layer has a coefficient of thermal expansion that is within 15 ppm/° C. of a coefficient of thermal expansion of the first integrated device.

4. The method of claim 2, wherein the first layer comprises a silicon-based dielectric or a polymer.

5. The method of claim 4, wherein the first layer comprises a polymer, and wherein the polymer has a glass transition temperature greater than 250° C.

6. The method of claim 4, wherein the first layer comprises a polymer, and wherein the polymer comprises a plurality of filler particles therein.

7. The method of claim 1, further comprising removing a portion of a backside of the first integrated device die to expose a back surface of the first integrated device die.

8. The method of claim 1, further comprising providing a second layer on the first layer and removing at least a portion of the second layer.

9. The method of claim 2, further comprising planarizing a remaining portion of the first layer which remains over the first integrated device die.

10. The method of claim 1, further comprising providing the first layer on an exposed surface of a third integrated device die, the third integrated device die positioned laterally adjacent the first integrated device die.

11. The method of claim 8, further comprising providing a third layer over the second layer.

12. A method for forming a bonded structure, the method comprising:
    mounting a first singulated integrated device die to a carrier;
    after mounting, thinning the first integrated device die; and
    providing a protective material comprising a first layer on an exposed surface of the first integrated device die;
    removing at least a portion of the first layer; and providing an electrical interconnect exposed through at least the exposed surface of the first integrated device die.

13. The method of claim 12, wherein providing the first layer comprises depositing the first layer around the electrical interconnect.

14. The method of claim 12, wherein providing the electrical interconnect comprises forming the electrical interconnect after removing the at least a portion of the first layer.

15. The method of claim 12, wherein mounting the first singulated integrated device die to the carrier comprises directly bonding the first singulated integrated device die to the carrier such that respective bonding surfaces of the first singulated integrated device die and the carrier are in direct contact.

16. A method for forming a bonded structure, the method comprising:
mounting a first singulated integrated device die to a carrier;
after mounting, thinning the first integrated device die; and
providing a protective material comprising a first layer on an exposed surface of the first integrated device die,
wherein providing the protective material comprises depositing the first layer to a thickness no less than a thickness of the first integrated device die, the thickness of the first integrated device die defined between a back surface and a front surface of the first integrated device die.

17. The method of claim 16, wherein mounting the first singulated integrated device die to the carrier comprises directly bonding the first singulated integrated device die to the carrier such that respective bonding surfaces of the first singulated integrated device die and the carrier are in direct contact.

18. A bonded structure comprising:
a carrier;
a first integrated device die having a lower surface directly bonded to an upper surface of the carrier without an intervening adhesive such that the lower surface of the first integrated device die and the upper surface of the carrier are in direct contact, the first integrated device die comprising an upper surface opposite the lower surface and a side surface between the upper and lower surfaces of the first integrated device die;
a second integrated device die directly bonded to the upper surface of the first integrated device die; and
a protective material comprising a first layer having a first portion disposed on the side surface of the first integrated device die.

19. The structure of claim 18, wherein a second portion of the first layer is disposed on the upper surface of the first integrated device die between the first and second integrated device dies.

20. The structure of claim 18, wherein the first layer has a coefficient of thermal expansion that is within 10 ppm/° C. of a coefficient of thermal expansion of the first integrated device die.

21. The structure of claim 18, wherein the protective material comprises a second filler layer disposed over the first portion of the first layer on the side surface of the first integrated device die.

22. The structure of claim 21, wherein the protective material comprises a third layer having a first portion disposed over the second portion of the first layer and a second portion disposed over the second filler layer.

23. The structure of claim 18, wherein a Young's modulus of the first layer is in a range of 20 GPa to 200 GPa.

24. The structure of claim 18, wherein the first layer is harder than a bulk semiconductor material of the first integrated device die.

25. A method for forming a bonded structure, the method comprising:
directly bonding a first integrated device die to a carrier without an intervening adhesive such that respective bonding surfaces of the first integrated device die and the carrier are in direct contact; and
after directly bonding, providing a protective material comprising a first layer on a surface of the first integrated device die; and
planarizing at least a portion of the first layer to remove a portion of the first integrated device die.

26. The method of claim 25, further comprising removing a portion of a backside of the first integrated device die to expose a back surface of the first integrated device die.

27. The method of claim 25, wherein providing the first layer comprises depositing the first layer to a thickness no less than a thickness of the first integrated device die, the thickness of the first integrated device die defined between a back surface and a front surface of the first integrated device die.

28. The method of claim 25, further comprising providing a second layer on the first layer and removing at least a portion of the second layer.

29. A method for forming a bonded structure, the method comprising:
mounting a first integrated device die to a carrier; and
after mounting, providing a protective material comprising a first layer on a surface of the first integrated device die; and
planarizing at least a portion of the first layer to remove a portion of the first integrated device die, wherein the first layer has a coefficient of thermal expansion that is within 10 ppm/° C. of a coefficient of thermal expansion of the first integrated device die.

30. The method of claim 29, wherein mounting the first integrated device die to the carrier comprises directly bonding the first integrated device die to the carrier such that respective bonding surfaces of the first integrated device die and the carrier are in direct contact.

* * * * *